(12) United States Patent
Ohmaru

(10) Patent No.: US 9,077,333 B2
(45) Date of Patent: Jul. 7, 2015

(54) SEMICONDUCTOR DEVICE

(71) Applicant: Semiconductor Energy Laboratory Co., Ltd., Atsugi-shi, Kanagawa-ken (JP)

(72) Inventor: Takuro Ohmaru, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/188,734

(22) Filed: Feb. 25, 2014

(65) Prior Publication Data

US 2014/0167817 A1    Jun. 19, 2014

Related U.S. Application Data

(63) Continuation of application No. 13/481,148, filed on May 25, 2012, now Pat. No. 8,669,781.

(30) Foreign Application Priority Data

May 31, 2011    (JP) .................... 2011-121559

(51) Int. Cl.
   *H01L 25/00*    (2006.01)
   *H03K 19/094*   (2006.01)
   *H03K 19/00*    (2006.01)
   *H03K 19/177*   (2006.01)

(52) U.S. Cl.
   CPC ...... *H03K 19/0013* (2013.01); *H03K 19/17744* (2013.01); *H01L 25/00* (2013.01); *H03K 19/177* (2013.01); *H01L 2924/0002* (2013.01)

(58) Field of Classification Search
   USPC .................. 326/41, 44, 39, 40, 112, 113, 119
   See application file for complete search history.

(56) References Cited

U.S. PATENT DOCUMENTS 5,164,612 A    11/1992    Kaplinsky
5,381,058 A    1/1995    Britton et al.
(Continued)

FOREIGN PATENT DOCUMENTS

EP    1 737 044 A1    12/2006
EP    2 226 847 A2    9/2010
(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
(Continued)

*Primary Examiner* — Daniel D Chang
(74) *Attorney, Agent, or Firm* — Fish & Richardson P.C.

(57) ABSTRACT

A programmable analog device and an analog device that can retain data even when supply of a power supply potential is interrupted and consumes less power. In a semiconductor device, first to fourth transistors are used as switches in a unit cell including an analog element, and the output of the unit cell switches between a conducting state, a non-conducting state, and a conducting state through the analog element by controlling the potential of a first node where the first transistor and the second transistor are connected and the potential of a second node where the third transistor and the fourth transistor are connected.

23 Claims, 26 Drawing Sheets

(56) References Cited

U.S. PATENT DOCUMENTS

| | | | |
|---|---|---|---|
| 5,635,859 A | 6/1997 | Yokota et al. | |
| 5,677,691 A | 10/1997 | Hosticka | |
| 5,731,856 A | 3/1998 | Kim | |
| 5,744,864 A | 4/1998 | Cillessen | |
| 5,796,128 A | 8/1998 | Tran et al. | |
| 6,057,707 A | 5/2000 | Schleicher et al. | |
| 6,118,300 A | 9/2000 | Wittig et al. | |
| 6,127,702 A | 10/2000 | Yamazaki et al. | |
| 6,130,553 A | 10/2000 | Nakaya | |
| 6,172,521 B1 | 1/2001 | Motomura | |
| 6,294,274 B1 | 9/2001 | Kawazoe | |
| 6,384,628 B1 | 5/2002 | Lacey et al. | |
| 6,563,174 B2 | 5/2003 | Kawasaki | |
| 6,727,522 B1 | 4/2004 | Kawasaki | |
| 6,856,173 B1 | 2/2005 | Chun | |
| 6,856,542 B2 | 2/2005 | Roy | |
| 6,924,663 B2 | 8/2005 | Masui et al. | |
| 7,049,190 B2 | 5/2006 | Takeda | |
| 7,061,014 B2 | 6/2006 | Hosono | |
| 7,064,346 B2 | 6/2006 | Kawasaki | |
| 7,105,868 B2 | 9/2006 | Nause | |
| 7,199,618 B2 | 4/2007 | Gliese et al. | |
| 7,211,825 B2 | 5/2007 | Shih | |
| 7,282,782 B2 | 10/2007 | Hoffman | |
| 7,297,977 B2 | 11/2007 | Hoffman | |
| 7,323,356 B2 | 1/2008 | Hosono | |
| 7,385,224 B2 | 6/2008 | Ishii | |
| 7,402,506 B2 | 7/2008 | Levy | |
| 7,411,209 B2 | 8/2008 | Endo | |
| 7,453,065 B2 | 11/2008 | Saito | |
| 7,453,087 B2 | 11/2008 | Iwasaki | |
| 7,462,862 B2 | 12/2008 | Hoffman | |
| 7,468,304 B2 | 12/2008 | Kaji | |
| 7,501,293 B2 | 3/2009 | Ito | |
| 7,674,650 B2 | 3/2010 | Akimoto | |
| 7,732,819 B2 | 6/2010 | Akimoto | |
| 8,026,739 B2 | 9/2011 | Sullam | |
| 8,138,786 B2 | 3/2012 | Lewis et al. | |
| 8,232,833 B2* | 7/2012 | Tran et al. | 327/536 |
| 8,294,489 B2* | 10/2012 | Tanamoto et al. | 326/41 |
| 8,300,031 B2* | 10/2012 | Kimura | 345/204 |
| 2001/0046027 A1 | 11/2001 | Tai | |
| 2002/0056838 A1 | 5/2002 | Ogawa | |
| 2002/0132454 A1 | 9/2002 | Ohtsu | |
| 2003/0189401 A1 | 10/2003 | Kido | |
| 2003/0218222 A1 | 11/2003 | Wager | |
| 2004/0038446 A1 | 2/2004 | Takeda | |
| 2004/0127038 A1 | 7/2004 | Carcia | |
| 2005/0017302 A1 | 1/2005 | Hoffman | |
| 2005/0199959 A1 | 9/2005 | Chiang | |
| 2005/0264347 A1 | 12/2005 | Gyohten | |
| 2006/0035452 A1 | 2/2006 | Carcia | |
| 2006/0043377 A1 | 3/2006 | Hoffman | |
| 2006/0091793 A1 | 5/2006 | Baude | |
| 2006/0108529 A1 | 5/2006 | Saito | |
| 2006/0108636 A1 | 5/2006 | Sano | |
| 2006/0110867 A1 | 5/2006 | Yabuta | |
| 2006/0113536 A1 | 6/2006 | Kumomi | |
| 2006/0113539 A1 | 6/2006 | Sano | |
| 2006/0113549 A1 | 6/2006 | Den | |
| 2006/0113565 A1 | 6/2006 | Abe | |
| 2006/0169973 A1 | 8/2006 | Isa | |
| 2006/0170111 A1 | 8/2006 | Isa | |
| 2006/0197092 A1 | 9/2006 | Hoffman | |
| 2006/0208977 A1 | 9/2006 | Kimura | |
| 2006/0228974 A1 | 10/2006 | Theiss | |
| 2006/0231882 A1 | 10/2006 | Kim | |
| 2006/0238135 A1 | 10/2006 | Kimura | |
| 2006/0244107 A1 | 11/2006 | Sugihara | |
| 2006/0284171 A1 | 12/2006 | Levy | |
| 2006/0284172 A1 | 12/2006 | Ishii | |
| 2006/0292777 A1 | 12/2006 | Dunbar | |
| 2007/0024187 A1 | 2/2007 | Shin | |
| 2007/0046191 A1 | 3/2007 | Saito | |
| 2007/0052025 A1 | 3/2007 | Yabuta | |
| 2007/0054507 A1 | 3/2007 | Kaji | |
| 2007/0090365 A1 | 4/2007 | Hayashi | |
| 2007/0108446 A1 | 5/2007 | Akimoto | |
| 2007/0152217 A1 | 7/2007 | Lai | |
| 2007/0172591 A1 | 7/2007 | Seo | |
| 2007/0187678 A1 | 8/2007 | Hirao | |
| 2007/0187760 A1 | 8/2007 | Furuta | |
| 2007/0194379 A1 | 8/2007 | Hosono | |
| 2007/0252928 A1 | 11/2007 | Ito | |
| 2007/0272922 A1 | 11/2007 | Kim | |
| 2007/0287296 A1 | 12/2007 | Chang | |
| 2008/0006877 A1 | 1/2008 | Mardilovich | |
| 2008/0038882 A1 | 2/2008 | Takechi | |
| 2008/0038929 A1 | 2/2008 | Chang | |
| 2008/0050595 A1 | 2/2008 | Nakagawara | |
| 2008/0073653 A1 | 3/2008 | Iwasaki | |
| 2008/0083950 A1 | 4/2008 | Pan | |
| 2008/0106191 A1 | 5/2008 | Kawase | |
| 2008/0128689 A1 | 6/2008 | Lee | |
| 2008/0129195 A1 | 6/2008 | Ishizaki | |
| 2008/0166834 A1 | 7/2008 | Kim | |
| 2008/0182358 A1 | 7/2008 | Cowdery-Corvan | |
| 2008/0224133 A1 | 9/2008 | Park | |
| 2008/0254569 A1 | 10/2008 | Hoffman | |
| 2008/0258139 A1 | 10/2008 | Ito | |
| 2008/0258140 A1 | 10/2008 | Lee | |
| 2008/0258141 A1 | 10/2008 | Park | |
| 2008/0258143 A1 | 10/2008 | Kim | |
| 2008/0296568 A1 | 12/2008 | Ryu | |
| 2008/0308805 A1 | 12/2008 | Akimoto et al. | |
| 2009/0068773 A1 | 3/2009 | Lai | |
| 2009/0073325 A1 | 3/2009 | Kuwabara | |
| 2009/0114910 A1 | 5/2009 | Chang | |
| 2009/0134399 A1 | 5/2009 | Sakakura | |
| 2009/0152506 A1 | 6/2009 | Umeda | |
| 2009/0152541 A1 | 6/2009 | Maekawa | |
| 2009/0167352 A1 | 7/2009 | Norman | |
| 2009/0278122 A1 | 11/2009 | Hosono | |
| 2009/0280600 A1 | 11/2009 | Hosono | |
| 2010/0065844 A1 | 3/2010 | Tokunaga | |
| 2010/0092800 A1 | 4/2010 | Itagaki | |
| 2010/0109002 A1 | 5/2010 | Itagaki | |
| 2010/0133589 A1 | 6/2010 | Aruga | |
| 2010/0148171 A1 | 6/2010 | Hayashi et al. | |
| 2011/0175646 A1 | 7/2011 | Takemura et al. | |
| 2012/0212995 A1 | 8/2012 | Kurokawa | |
| 2012/0268164 A1 | 10/2012 | Kobayashi et al. | |
| 2012/0293202 A1 | 11/2012 | Nishijima et al. | |
| 2012/0293203 A1 | 11/2012 | Ohmaru et al. | |
| 2012/0293206 A1 | 11/2012 | Yoneda et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-047715 A | 2/1992 |
| JP | 05-031366 A | 2/1993 |
| JP | 05-251705 A | 9/1993 |
| JP | 07-005071A U | 1/1995 |
| JP | 08-264794 A | 10/1996 |
| JP | 09-027732 A | 1/1997 |
| JP | 11-505377 T | 5/1999 |
| JP | 2000-044236 A | 2/2000 |
| JP | 2000-150900 A | 5/2000 |
| JP | 2001-094412 A | 4/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-015060 A | 1/2004 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2007-096055 A | 4/2007 |
| JP | 2007-123861 A | 5/2007 |
| WO | WO 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09: SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and SN-Doped Zinc Indium Oxide Thin Film Transistors for Amoled Back-Plane," SID Digest '09: SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08: SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID, 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper: Transparent Amorphous Oxide Semiconductors for High Performance TFT," SID Digest '07: SID International Symposium Digest of technical Papers, 2007, vol. 38, pp. 1830-1833.

Hsieh, H et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Ikeda, T et al., "Full-Functional System Liquid Crystal Display Using CG-Silicon Technology," SID Digest '04: SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3-BO Systems [A; Fe, Ga, or Al; B: Mg, Mn, Fe, Ni, Cu, or Zn] At Temperatures Over 1000°C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits, 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007,vol. 98, pp. 045501-1-045501-4.

Lee, H et al., "Current Status of, Challenges to, and Perspective View of AM-OLED," IDW '06: Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

Lee, M et al., "15.4: Excellent Performance of Indium—Oxide—Based Thin-Film Transistors by DC Sputtering," SID Digest '09: SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07: SID International Symposium Digest of Technical Papers, 2007, vol. 38, pp. 1673-1676.

Mo, Y et al., "Amorphous Oxide TFT Backplanes for Large Size AMOLED Displays," IDW '08: Proceedings of the 6th International Display Workshops, Dec. 3, 2008, pp. 581-584.

(56) References Cited

OTHER PUBLICATIONS

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350°C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09: SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS with a Novel Passivation Layer," SID Digest '09: SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09: Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08: Proceedings of the 15th International Display Workshops, Dec. 3, 2008, pp. 1637-1640.

Tsuda, K et al., "Ultra Low Power Consumption Technologies for Mobile TFT—LCDs," IDW '02: Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Spplied Physics Letters), Sep. 1, 2003, vol. 83, No. 9, pp. 1755-1757.

Van de Walle, C, "Hydrogen as a Cause of Doping in Zinc Oxide," Phys. Rev. Lett. (Physical Review Letters), Jul. 31, 2000, vol. 85, No. 5, pp. 1012-1015.

Choi, D et al., "New Non-Volatile Memory Structures for FPGA Architectures," IEEE Transactions on Very Large Scale Integration (VLSI) Systems, Jul. 1, 2008, vol. 16, No. 7, pp. 874-881, IEEE.

Ishii, T et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Kim, W et al., "An Experimental High-Density DRAM Cell with a Built-in Gain Stage," IEEE Journal of Solid-State Circuits, Aug. 1, 1994, vol. 29, No. 8, pp. 978-981.

Shukuri, S et al., "A Complementary Gain Cell Technology for sub-1 V Supply DRAMs," IEDM 92: Technical Digest of International Electron Devices Meeting, Dec. 13, 1992, pp. 1006-1008.

Shukuri, S et al., "A Semi-Static Complementary Gain Cell Technology for Sub-1 V Supply DRAM's," IEEE Transactions on Electron Devices, Jun. 1, 1994, vol. 41, No. 6, pp. 926-931.

\* cited by examiner

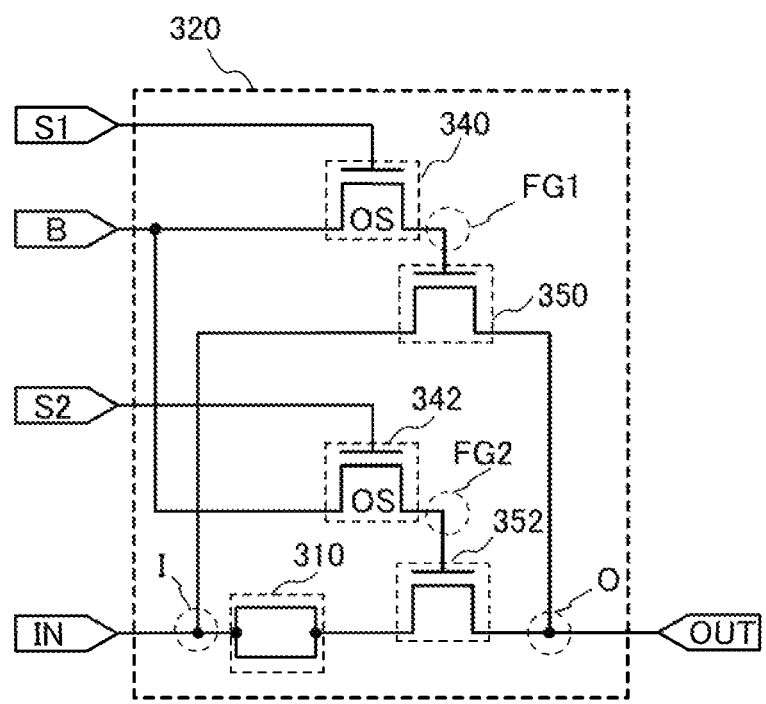

● In
○ Sn
○ Zn
• O

● In
◐ Ga
○ Zn
● O

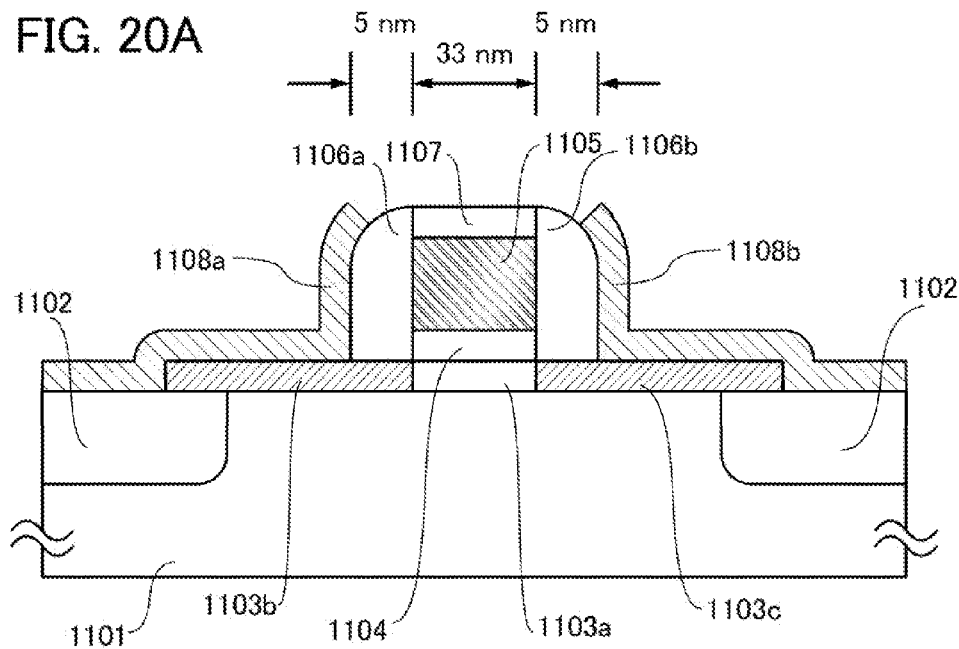
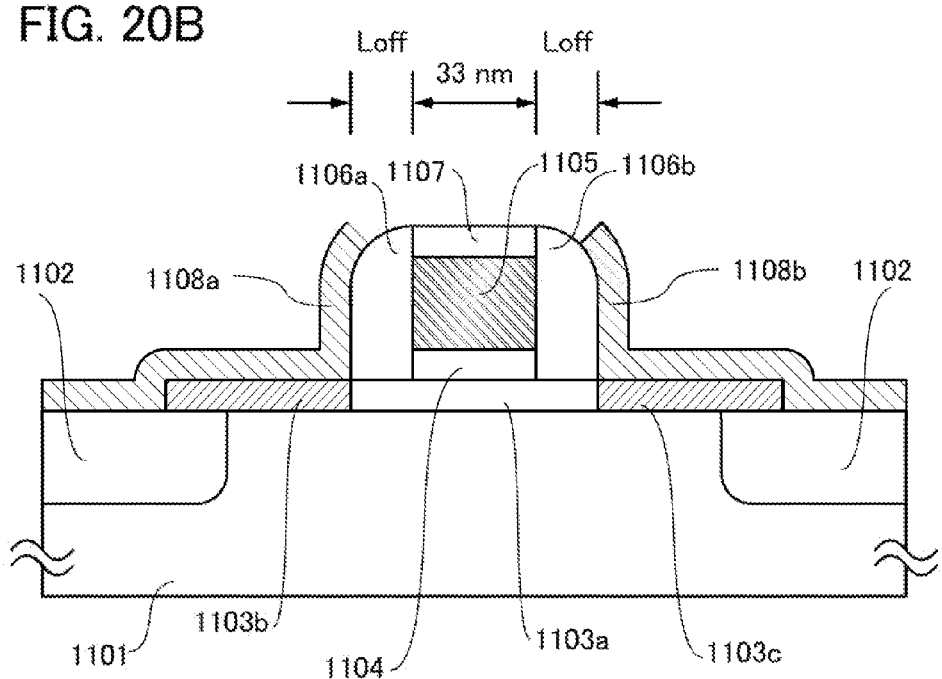

SEMICONDUCTOR DEVICE

CROSS-REFERENCE TO RELATED APPLICATIONS

This application is a continuation of U.S. application Ser. No. 13/481,148, filed May 25, 2012, now allowed, which claims the benefit of a foreign priority application filed in Japan as Serial No. 2011-121559 on May 31, 2011, both of which are incorporated by reference.

BACKGROUND OF THE INVENTION

1. Field of the Invention

The invention disclosed in this specification relates to semiconductor devices.

Note that a semiconductor device in this specification and the like refers to any device that can function by utilizing semiconductor characteristics, and semiconductor elements, electro-optical devices, storage devices, signal processing units, semiconductor circuits, and electronic devices are all semiconductor devices.

2. Description of the Related Art

The configurations of semiconductor integrated circuits typified by LSIs are fixed at the time of manufacture and cannot be generally changed after manufacture. In contrast, in semiconductor integrated circuits called programmable logic devices (PLDs), a logic block composed of a plurality of logic circuits is considered as a unit and logic blocks are electrically connected to each other through wirings. In a programmable logic device, the circuit configuration of each logic block can be electrically controlled.

As above, the design of a programmable logic device can be changed after manufacture; thus, the use of a programmable logic device can drastically reduce the time and costs needed to design and develop semiconductor integrated circuits.

There are some programmable logic devices called complex PLD (CPLD) and field programmable gate array (FPGA). In either device, the circuit configuration of each logic block is controlled by a programmable switch that is switched in accordance with data (configuration data) stored in a memory unit provided in the logic block. In other words, programming data into each programmable switch makes it possible to change the circuit configuration of a programmable logic device.

Volatile memory such as SRAM is used as the memory unit. On the other hand, for example, Patent Document 1 discloses a technique for using nonvolatile memory composed of a floating gate transistor, such as flash memory, as the memory unit.

In addition, a programmable analog circuit having an array composed of functional units including analog elements has been developed.

REFERENCE

Patent Document 1: Japanese Published Patent Application No. 2004-015060

SUMMARY OF THE INVENTION

Although a programmable circuit including an analog circuit (analog element) is not as widely used as a programmable logic device including a digital circuit, development of the programmable circuit is desired in terms of lower cost, higher degree of design freedom, and the like of the circuit.

In recent years, the reduction in power consumption of electronic devices has been an important issue, and lower power consumption of semiconductor integrated circuits used in electronic devices has also been strongly required. In view of the above, in order to reduce power consumption, a driving method is proposed by which supply of a power supply potential to the entire semiconductor device or part of the semiconductor device is temporarily interrupted and supply of the power supply potential is selected only when needed in a circuit unit that needs the supply.

When a memory unit in a programmable switch of a programmable logic device is made nonvolatile by using a floating gate transistor, data stored in a circuit unit is held even when supply of the power supply potential is temporarily interrupted. However, since electrons are injected into a floating gate to write data, a high potential is required, leading to the increase in power consumption. Moreover, tunneling current generated in data writing causes deterioration of a gate insulating layer of a floating gate. Further, a floating gate transistor has low data read/write speed and is thus unsuitable for intermittent operation.

In view of the above problems, an object of one embodiment of the present invention is to provide a programmable analog device. Another object of one embodiment of the present invention is to provide an analog device that can retain data even when supply of a power supply potential is interrupted and consumes less power.

According to one embodiment of the disclosed invention, first to fourth transistors are used as switches in a unit cell including an analog element, and the output of the unit cell switches between a conducting state, a non-conducting state, and a conducting state through the analog element by controlling the potential of a first node where the first transistor and the second transistor are connected and the potential of a second node where the third transistor and the fourth transistor are connected. Specifically, any of the following structures can be employed, for example.

According to one embodiment of the present invention, a semiconductor device includes a programmable circuit including a unit cell, a bit line, a unit cell selection line, an analog element selection line, an input signal line, and an output signal line. The unit cell includes a first transistor, a second transistor, a third transistor, a fourth transistor, and an analog element. The unit cell selection line and a gate electrode of the first transistor are electrically connected to each other. The bit line, one of a source electrode and a drain electrode of the first transistor, and one of a source electrode and a drain electrode of the third transistor are electrically connected to each other. The analog element selection line and a gate electrode of the third transistor are electrically connected to each other. The input signal line, one of a source electrode and a drain electrode of the second transistor, and one of electrodes of the analog element are electrically connected to each other. The other of the electrodes of the analog element and one of a source electrode and a drain electrode of the fourth transistor are electrically connected to each other. The output signal line, the other of the source electrode and the drain electrode of the second transistor, and the other of the source electrode and the drain electrode of the fourth transistor are electrically connected to each other. The other of the source electrode and the drain electrode of the first transistor and a gate electrode of the second transistor are electrically connected to each other to form a first node. The other of the source electrode and the drain electrode of the third transistor and a gate electrode of the fourth transistor are electrically connected to each other to form a second node.

According to another embodiment of the present invention, a semiconductor device includes a programmable circuit including a plurality of unit cells arranged in a matrix, a plurality of bit lines, a plurality of unit cell selection lines, a plurality of analog element selection lines, an input signal line, and an output signal line. One of the unit cells includes a first transistor, a second transistor, a third transistor, a fourth transistor, and an analog element. One of the unit cell selection lines and a gate electrode of the first transistor are electrically connected to each other. One of the bit lines, one of a source electrode and a drain electrode of the first transistor, and one of a source electrode and a drain electrode of the third transistor are electrically connected to each other. One of the analog element selection lines and a gate electrode of the third transistor are electrically connected to each other. The input signal line, one of a source electrode and a drain electrode of the second transistor, and one of electrodes of the analog element are electrically connected to each other. The other of the electrodes of the analog element and one of a source electrode and a drain electrode of the fourth transistor are electrically connected to each other. The output signal line, the other of the source electrode and the drain electrode of the second transistor, and the other of the source electrode and the drain electrode of the fourth transistor are electrically connected to each other. The other of the source electrode and the drain electrode of the first transistor and a gate electrode of the second transistor are electrically connected to each other to form a first node. The other of the source electrode and the drain electrode of the third transistor and a gate electrode of the fourth transistor are electrically connected to each other to form a second node. An analog value synthesized by the programmable circuit varies along with an output of each of the unit cells controlled in accordance with a potential of the first node and a potential of the second node.

In any one of the above semiconductor devices, at least one of the first transistor and the third transistor preferably includes a wide bandgap semiconductor such as an oxide semiconductor.

Moreover, in any one of the above semiconductor devices, a resistor is preferably used as the analog element.

The first to fourth transistors are provided in the unit cell including the analog element and the output of the unit cell is controlled by the potentials supplied to the nodes of the transistors, whereby the output of the unit cell can be switched simply and accurately. Further, when a plurality of unit cells are provided in the programmable circuit and the output of each unit cell is controlled, an analog value that can be synthesized by the programmable circuit can be variable; therefore, the circuit can be optimized by adjusting the analog value. Thus, a versatile programmable circuit can be provided.

When transistors including a wide bandgap semiconductor (e.g., an oxide semiconductor) with sufficiently low off-state current are used as the first and third transistors included in the unit cell, data for switching the output of the unit cell can be held for a long time even while supply of the power supply potential is interrupted. Consequently, power consumption of the semiconductor device can be reduced.

BRIEF DESCRIPTION OF THE DRAWINGS

In the accompanying drawings:

FIG. 1 is a circuit diagram illustrating a semiconductor device according to one embodiment of the present invention;

FIGS. 20A and 20B illustrate cross-sectional structures of transistors used in calculation;

DETAILED DESCRIPTION OF THE INVENTION

Figure 2A:
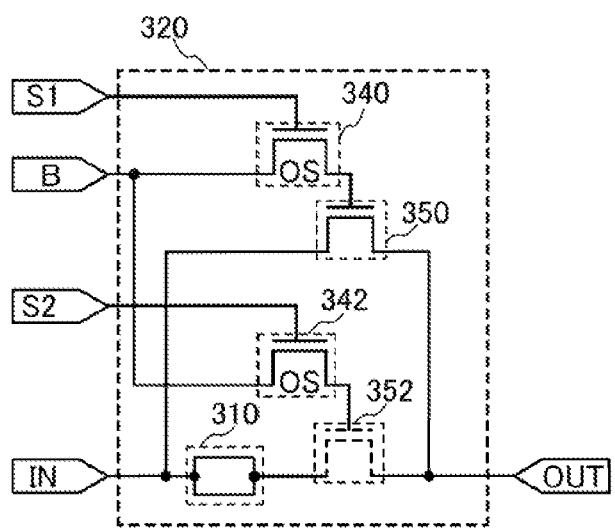
FIGS. 2A to 2C are circuit diagrams illustrating a semiconductor device according to one embodiment of the present invention.

Embodiments of the present invention will be described below with reference to the accompanying drawings. Note that the present invention is not limited to the following description, and it is easily understood by those skilled in the art that the mode and details can be variously changed without departing from the spirit and scope of the present invention. Therefore, the present invention should not be limited to the descriptions of the embodiments below.

Note that in this specification and the like, functions of the "source" and "drain" may be replaced with each other when a transistor of opposite polarity is employed or when the direction of a current flow changes in a circuit operation, for example. Therefore, the terms "source" and "drain" can be replaced with each other in this specification and the like.

In this specification and the like, the term "electrically connected" includes the case where components are connected through an object having any electric function. There is no particular limitation on an object having any electric function as long as electric signals can be transmitted and received between components that are connected through the object. Examples of an object having any electric function are a switching element such as a transistor, a resistor, an inductor, a capacitor (also referred to as a condenser), and an element with a variety of functions as well as an electrode and a wiring.

The position, size, range, or the like of each component illustrated in drawings and the like is not accurately represented in some cases for easy understanding. Therefore, the disclosed invention is not necessarily limited to the position, size, range, or the like disclosed in the drawings and the like.

Note that the ordinal numbers such as "first" and "second" in this specification and the like are used for convenience and do not denote the order of steps or the stacking order of layers. In addition, the ordinal numbers in this specification and the like do not denote particular names that specify the present invention. Moreover, these ordinal numbers are used in order to avoid confusion among components, and the terms do not limit the components numerically.

Embodiment 1

In this embodiment, a circuit configuration of a semiconductor device according to one embodiment of the disclosed invention will be described with reference to FIG. 1 and FIGS. 2A to 2C.

<Basic Circuit>

FIG. 1 illustrates a configuration of a unit cell 320 included in a programmable circuit of this embodiment.

The unit cell 320 is electrically connected to a bit line B, a unit cell selection line S1, an analog element selection line S2, an input signal line IN, and an output signal line OUT.

The unit cell 320 includes a first transistor 340, a second transistor 350, a third transistor 342, a fourth transistor 352, and an analog element 310. In the unit cell 320 in FIG. 1, the unit cell selection line S1 and a gate electrode of the first transistor 340 are electrically connected to each other and the bit line B, one of a source electrode and a drain electrode of the first transistor 340, and one of a source electrode and a drain electrode of the third transistor 342 are electrically connected to each other.

The analog element selection line S2 and a gate electrode of the third transistor 342 are electrically connected to each other. A node I where one of a source electrode and a drain electrode of the second transistor 350 and one electrode of the analog element 310 are electrically connected to each other functions as an input terminal of the unit cell 320. That is, the input signal line IN, one of the source electrode and the drain electrode of the second transistor 350, and the one electrode of the analog element 310 are electrically connected to each other. The other electrode of the analog element 310 and one of a source electrode and a drain electrode of the fourth transistor 352 are electrically connected to each other.

A node O where the other of the source electrode and the drain electrode of the second transistor 350 and the other of the source electrode and the drain electrode of the fourth transistor 352 are electrically connected to each other functions as an output terminal of the unit cell 320. That is, the output signal line OUT, the other of the source electrode and the drain electrode of the second transistor 350, and the other of the source electrode and the drain electrode of the fourth transistor 352 are electrically connected to each other. The other of the source electrode and the drain electrode of the first transistor 340 and a gate electrode of the second transistor 350 are electrically connected to each other, thereby forming a first node FG1. The other of the source electrode and the drain electrode of the third transistor 342 and a gate electrode of the fourth transistor 352 are electrically connected to each other, thereby forming a second node FG2.

Examples of the analog element 310 applicable to the unit cell 320 are a resistor, a capacitor, a coil, and a photoelectric conversion element.

The output of the unit cell 320 can be controlled by the potentials of the first node FG1 and the second node FG2. For example, when the potential of the first node FG1 is higher than or equal to the threshold voltage of the second transistor 350, the unit cell 320 is brought into a conducting state regardless of the potential of the second node FG2 (a first operation mode). When the potential of the first node FG1 is lower than the threshold voltage of the second transistor 350 and the potential of the second node FG2 is lower than the threshold voltage of the fourth transistor 352, the unit cell 320 is brought into a non-conducting state (a second operation mode). When the potential of the first node FG1 is lower than the threshold voltage of the second transistor 350 and the potential of the second node FG2 is higher than or equal to the threshold voltage of the fourth transistor 352, the unit cell 320 is brought into a conducting state through the analog element 310, that is, a state in which electrical continuity is established through the analog element 310 (a third operation mode).

As described above, the first to fourth transistors are provided in the unit cell 320 and the output of the unit cell 320 is controlled by the potentials supplied to the nodes of the transistors, whereby the output of the unit cell 320 can be switched simply and accurately.

Note that one of the source electrode and the drain electrode of the first transistor 340 is electrically connected to the gate electrode of the second transistor 350, and thus has a function equivalent to a floating gate of a floating gate transistor used as a nonvolatile memory element. Moreover, one of the source electrode and the drain electrode of the third transistor 342 is electrically connected to the gate electrode of the fourth transistor 352, and thus has a function equivalent to a floating gate. It can be considered that the first node FG1 or the second node FG2 is buried in an insulator when the first transistor 340 or the third transistor 342 is off, and charge is held in the node.

Here, preferably at least one of the first transistor 340 and the third transistor 342 is a transistor with extremely low off-state current, and further preferably both the first transistor 340 and the third transistor 342 are transistors with extremely low off-state current. An example of such a transistor is a transistor including a wide bandgap semiconductor material such as an oxide semiconductor. When a transistor with extremely low off-state current is used as the first transistor 340, the loss of charge stored in the first node FG1 due to leakage of the first transistor 340 can be ignored. In other words, the use of a transistor including an oxide semiconductor or the like makes it possible to hold the potential of the first node FG1 for an extremely long time even when power is not supplied. Similarly, when a transistor with extremely low off-state current is used as the third transistor 342, turning off the third transistor 342 makes it possible to hold the potential of the second node FG2 for an extremely long time.

Note that there is no particular limitation on a semiconductor material for the second transistor 350 and the fourth transistor 352. In terms of increasing the output speed of the potential of the analog element 310, it is preferable to use a transistor with high switching rate, for example, a transistor including single crystal silicon. Alternatively, like the first transistor 340 and the like, the second transistor 350 or the fourth transistor 352 may include a wide bandgap semiconductor such as an oxide semiconductor.

In this embodiment, a transistor including an oxide semiconductor is used as the first transistor 340 and the third transistor 342. Note that in circuit diagrams, "OS" is sometimes written beside a transistor in order to indicate that the transistor includes an oxide semiconductor.

Figure 2B:
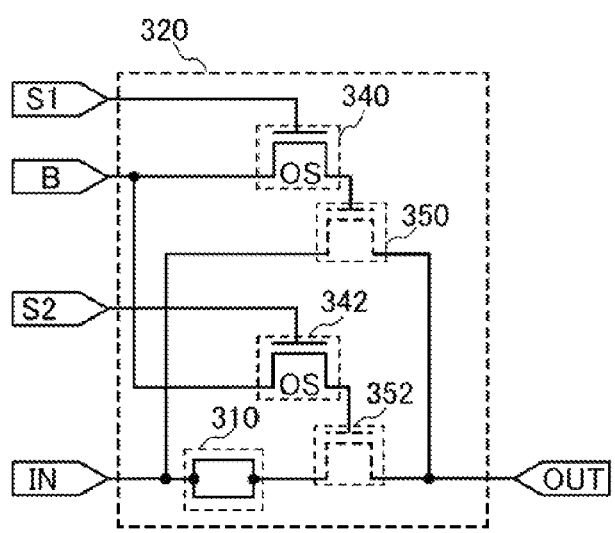
Figure 2C:
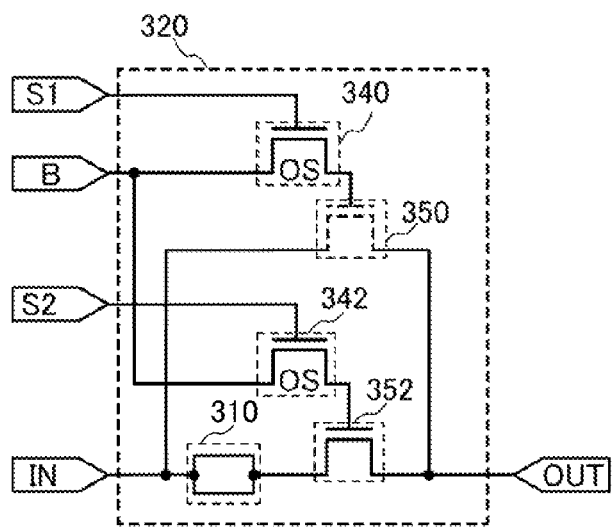

The operation of the unit cell 320 will be described below with reference to FIGS. 2A to 2C. The case where the second transistor 350 and the fourth transistor 352 are n-channel transistors is described as an example; however, this embodiment is not limited to this. In FIGS. 2A to 2C, transistors indicated by solid lines mean the transistors are conducting (on), and transistors indicated by dashed lines mean the transistors are not conducting (off).

To start with, the first operation mode will be described with reference to FIG. 2A. First, the potential of the unit cell selection line S1 is set at a potential with which the first transistor 340 is turned on, so that the first transistor 340 is turned on. Thus, the potential of the bit line B is applied to the first node FG1. That is, predetermined charge is applied to the gate electrode of the second transistor 350. Here, the bit line B has a high potential, and the first node FG1 is supplied with a potential higher than or equal to the threshold voltage of the second transistor 350. Then, the potential of the unit cell selection line S1 is set at a potential with which the first transistor 340 is turned off.

Next, the potential of the analog element selection line S2 is set at a potential with which the third transistor 342 is turned on, so that the third transistor 342 is turned on. Thus, the potential of the bit line B is applied to the second node FG2. The fourth transistor 352 is off in FIG. 2A; however, this embodiment is not limited thereto. In the first operation mode, the fourth transistor 352 can be either on or off; consequently, the potential of the bit line B may be a high potential or a low potential (e.g., GND). Then, the potential of the analog element selection line S2 is set at a potential with which the third transistor 342 is turned off.

Next, a potential is supplied to the unit cell 320 from the input signal line IN. Since the potential applied to the first node FG1 is higher than or equal to the threshold voltage of the second transistor 350 in the first operation mode, the second transistor 350 is turned on, the unit cell 320 is brought into a conducting state, and the potential supplied to the input signal line IN is output to the output signal line OUT.

When the potential supplied to the input signal line IN is output to the output signal line OUT by turning on the second transistor 350, a potential that is higher than the maximum potential applied to the source electrode or the drain electrode of the second transistor 350 by the threshold voltage of the second transistor 350 is supplied to the first node FG1 so that the potential to be output is not decreased by the threshold voltage of the second transistor 350. Alternatively, a transmission gate and an inverter may be provided instead of the second transistor 350.

Next, the second operation mode will be described with reference to FIG. 2B. First, the potential of the unit cell selection line S1 is set at a potential with which the first transistor 340 is turned on, so that the first transistor 340 is turned on. In the second operation mode, the bit line B has a low potential, and the first node FG1 is supplied with a potential lower than the threshold voltage of the second transistor 350. Then, the potential of the unit cell selection line S1 is set at a potential with which the first transistor 340 is turned off.

Next, the potential of the analog element selection line S2 is set at a potential with which the third transistor 342 is turned on, so that the third transistor 342 is turned on. Here, the bit line B has a low potential, and the second node FG2 is supplied with a potential lower than the threshold voltage of the fourth transistor 352. Then, the potential of the analog element selection line S2 is set at a potential with which the third transistor 342 is turned off.

Next, a potential is supplied to the unit cell 320 from the input signal line IN. In the second operation mode, the potential applied to the first node FG1 is lower than the threshold voltage of the second transistor 350 and the potential applied to the second node FG2 is lower than the threshold voltage of the fourth transistor 352; thus, the unit cell 320 is brought into a non-conducting state.

Next, the third operation mode will be described with reference to FIG. 2C. First, the potential of the unit cell selection line S1 is set at a potential with which the first transistor 340 is turned on, so that the first transistor 340 is turned on. In the third operation mode, the bit line B has a low potential and the first node FG1 is supplied with a potential lower than the threshold voltage of the second transistor 350 as in the second operation mode. Then, the potential of the unit cell selection line S1 is set at a potential with which the first transistor 340 is turned off.

Next, the potential of the analog element selection line S2 is set at a potential with which the third transistor 342 is turned on, so that the third transistor 342 is turned on. Here, the bit line B has a high potential, and the second node FG2 is supplied with a potential higher than or equal to the threshold voltage of the fourth transistor 352. Then, the potential of the analog element selection line S2 is set at a potential with which the third transistor 342 is turned off.

Subsequently, a potential is supplied to the unit cell 320 from the input signal line IN. In the third operation mode, the potential applied to the first node FG1 is lower than the threshold voltage of the second transistor 350 and the potential applied to the second node FG2 is higher than or equal to the threshold voltage of the fourth transistor 352; thus, the unit cell 320 is brought into a conducting state through the analog element 310 and the potential passing through the analog element 310 is output to the output signal line OUT.

When the potential supplied to the input signal line IN is output to the output signal line OUT through the analog element 310 by turning on the fourth transistor 352, a potential that is higher than the maximum potential applied to the source electrode or the drain electrode of the fourth transistor 352 by the threshold voltage of the fourth transistor 352 is applied to the second node FG2 so that the potential to be output is not decreased by the threshold voltage of the fourth transistor 352. Alternatively, a transmission gate and an inverter may be provided instead of the fourth transistor 352.

As described above, the first to fourth transistors are used for the switches in the unit cell 320, and the output of the unit cell can switch between a conducting state, a non-conducting state, and a conducting state through the analog element 310 by controlling the potential of the first node FG1 where the first transistor 340 and the second transistor 350 are connected and the potential of the second node FG2 where the third transistor 342 and the fourth transistor 352 are connected.

In the first to third operation modes illustrated in FIGS. 2A to 2C, after the potential of the bit line B is stored in the first node FG1, when the potential of the unit cell selection line S1 is set at a potential with which the first transistor 340 is turned off to turn off the first transistor 340 while the potential of the bit line B is maintained, the potential applied to the first node FG1 can be held without supplying a new potential. Similarly, after the potential of the bit line B is stored in the second node FG2, when the potential of the analog element selection line S2 is set at a potential with which the third transistor 342 is turned off to turn off the third transistor 342 while the potential of the bit line B is maintained, the potential applied to the second node FG2 can be held without supplying a new potential.

In this embodiment, since the first transistor 340 and the third transistor 342 are formed using a wide bandgap semiconductor such as an oxide semiconductor and thus have extremely low off-state current, a predetermined potential applied to the first node FG1 and the second node FG2 is held for an extremely long time. Accordingly, a potential for switching the output of the unit cell 320 can be held without supply of the power supply potential. As a result, supply of the power supply potential to part of or the entire programmable circuit can be temporarily interrupted and the power supply potential can be supplied only when needed, so that power consumption can be reduced.

<Programmable Circuit 1>

Figure 3:
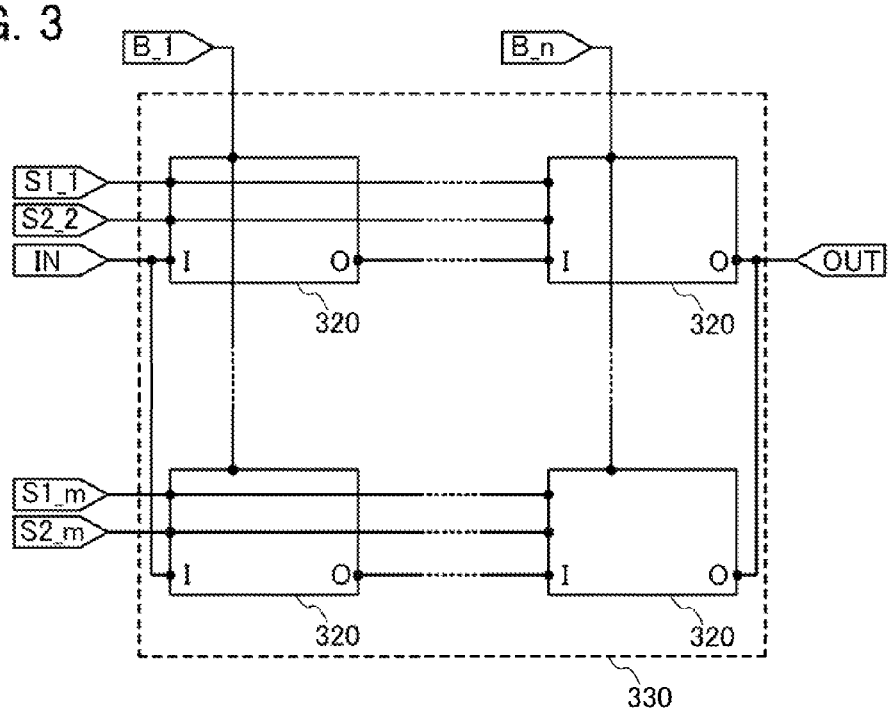
FIG. 3 is a circuit diagram illustrating a semiconductor device according to one embodiment of the present invention.

A circuit configuration to which the unit cell in FIG. 1 is applied will be described with reference to FIG. 3. A semiconductor device illustrated in FIG. 3 is a programmable circuit 330 including (m×n) unit cells that are arranged in a matrix and are connected between the input signal line IN and the output signal line OUT. Note that in the following description, wirings having a similar function are distinguished by "_1", "_2", "_n", and the like added to the end of their names.

The semiconductor device in FIG. 3 includes m unit cell selection lines S1 (m: an integer of 2 or more), m analog element selection lines S2, n bit lines B (n: an integer of 2 or more), the input signal line IN, the output signal line OUT, and a unit cell array in which the unit cells 320 are arranged in a matrix of m (rows) and n (columns).

The configuration of the unit cells 3210 included in the programmable circuit 330 in FIG. 3 is similar to that in FIG. 1; the output of each of the unit cells 320 (a conducting state, a non-conducting state, or a conducting state through the analog element) can be controlled by the potentials applied to the first node FG1 and the second node FG2 in the unit cells 320.

In FIG. 3, an input terminal I of the unit cell 320 corresponds to the node I in FIG. 1, where one of the source electrode and the drain electrode of the second transistor 350 and one electrode of the analog element 310 are connected to each other, and an output terminal O of the unit cell 320 corresponds to the node O in FIG. 1, where the other of the source electrode and the drain electrode of the second transistor 350 and the other of the source electrode and the drain electrode of the fourth transistor 352 are connected to each other.

An analog value output from the output signal line OUT is synthesized by the plurality of unit cells 320 included in the programmable circuit 330. Accordingly, by controlling the output from each of the unit cells 320, an analog value synthesized by the programmable circuit 330 can be made variable. As a result, the versatile programmable circuit 330 can be configured.

Assumption is made that the unit cells 320 are connected in a matrix and there are two kinds of outputs from the unit cell (a non-conducting state and a conducting state through the analog element). For example, when outputs from all the unit cells in the k-th column (k: an integer satisfying 2≤k≤n) are output without passing through the analog elements in a unit cell array in which the unit cells are arranged in a matrix of m rows and n columns, all the unit cells in the k-th column need to be brought into a non-conducting state. Therefore, the output signal line OUT needs to be provided for every column in order to obtain an analog value output from the other columns. In contrast, the unit cell 320 in this embodiment can be brought into a conducting state without using the analog element, by switching the output of the unit cell 320 with the use of the combination of the potentials of the first node FG1 and the second node FG2. Thus, a variety of combinations of outputs can be output without providing a plurality of output signal lines OUT, so that the size and cost of the semiconductor device can be reduced and the programmable circuit with higher versatility can be provided.

<Programmable Circuit 2>

Figure 4:
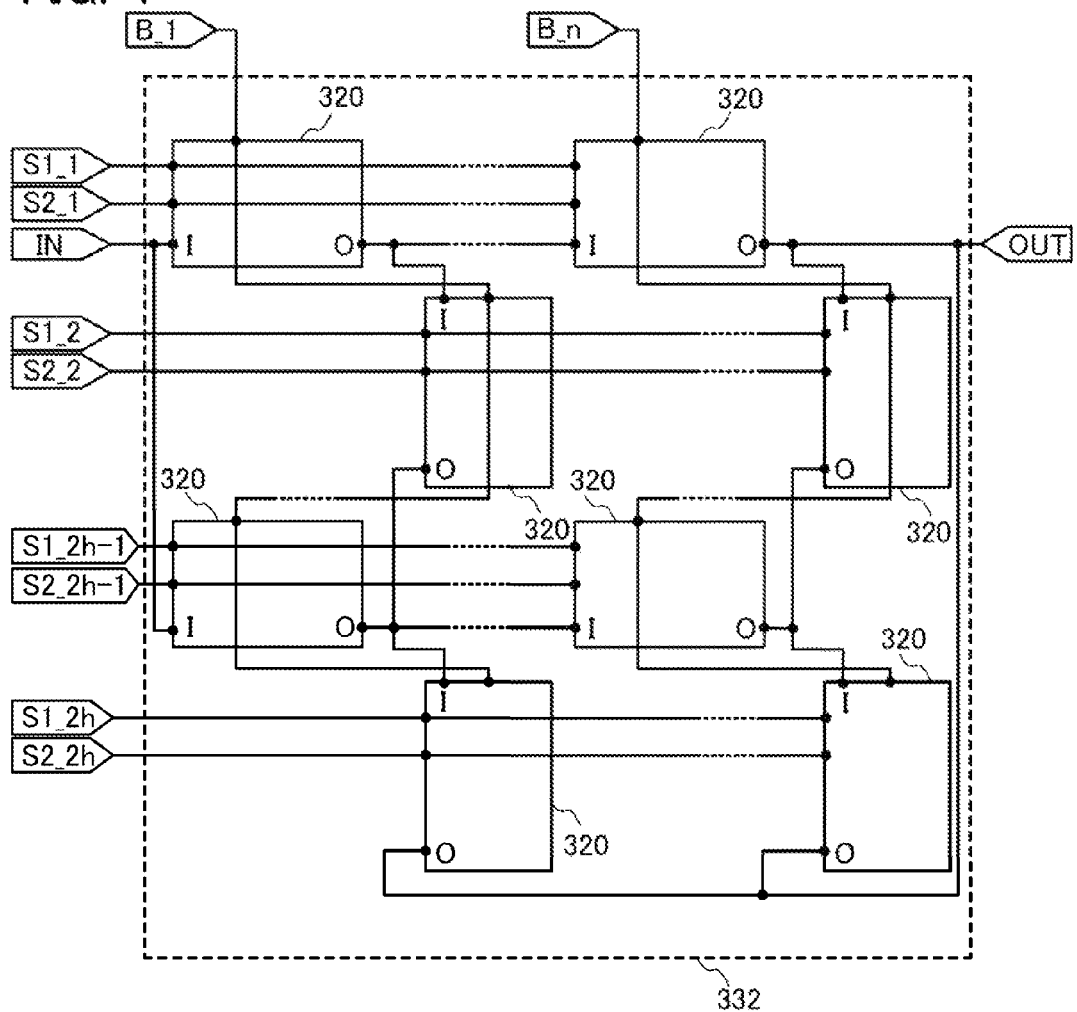
FIG. 4 is a circuit diagram illustrating a semiconductor device according to one embodiment of the present invention.

A circuit configuration to which the unit cell in FIG. 1 is applied and which is different from that in FIG. 3 will be described with reference to FIG. 4. A semiconductor device illustrated in FIG. 4 is a programmable circuit 332 including (2h×n) unit cells that are arranged in a matrix and are connected between the input signal line IN and the output signal line OUT. Note that in the following description, wirings having a similar function are distinguished by "_1", "_2", "_n", and the like added to the end of their names.

The semiconductor device in FIG. 4 includes 2h unit cell selection lines S1 (I: an integer of 1 or more), 2h analog element selection lines S2, n bit lines B (n: an integer of 2 or more), the input signal line IN, the output signal line OUT, and a unit cell array in which the unit cells 320 are arranged in a matrix of 2h (rows) and n (columns). Although FIG. 4 illustrates the unit cell array including the unit cells 320 of even-numbered rows, this embodiment is not limited thereto and the unit cell array may include the unit cells 320 of odd-numbered rows.

The configuration of the unit cells 320 included in the programmable circuit 332 in FIG. 4 is similar to that in FIG. 1: the output of each of the unit cells 320 (a conducting state, a non-conducting state, or a conducting state through the analog element) can be controlled by the potentials applied to the first node FG1 and the second node FG2 in the unit cells 320.

As in the programmable circuit 330 in FIG. 3, the unit cell array in the programmable circuit 332 in FIG. 4 is configured in the following manner: the unit cells 320 of n columns (the unit cells in one column is electrically connected to a common bit line B) are connected in parallel to each other, and the unit cells in the h-th row which are electrically connected to a common unit cell selection line S1 and a common analog element selection line S2 are connected in series with each other. The difference between the programmable circuit 330 and the programmable circuit 332 is a way of connecting the output terminal (or the input terminal) of one unit cell 320 and the input terminal (or the output terminal) of another unit cell adjacent to the unit cell 320.

In the programmable circuit 330, the input terminal of the unit cell 320 in the p-th row (p: an integer satisfying 2≤p≤n) and the k-th column is electrically connected to the output terminal of the unit cell 320 in the p-th row and the (k−1)th column, and the output terminal thereof is electrically connected to the input terminal of the unit cell 320 in the p-th row and the (k+1)th column. Consequently, the potential supplied from the input signal line IN is supplied to m unit cells 320 connected in series in the first column, and then transferred to every row.

On the other hand, in the programmable circuit 332 in FIG. 4, the input terminal of the unit cell 320 in the (2q+1)th row (q: an integer satisfying 1≤q≤h) and the k-th column is electrically connected to the output terminal of the unit cell 320 in the (2q+1)th row and the (k−1)th column, the output terminal of the unit cell 320 in the 2q-th row and the (k−1)th column, and the input terminal of the unit cell 320 in the (2q+2)th row and the (k−1)th column. The output terminal of the unit cell 320 in the (2q+1)th row and the k-th column is electrically connected to the input terminal of the unit cell 320 in the (2q+1)th row and the (k+1)th column, the output terminal of the unit cell 320 in the 2q-th row and the k-th column, and the input terminal of the unit cell 320 in the (2q+2th row and the k-th column. As a result, the potential supplied from the input signal line IN is supplied to unit cells 320 of odd-numbered rows among h unit cells 320 connected in series in the first column, and then transferred in the row direction and the column direction.

When the input terminal (or the output terminal) of the unit cell 320 is electrically connected to the output terminals (or the input terminals) of the unit cells 320 adjacent to the unit cell 320 in the row direction and the column direction as illustrated in FIG. 4, a more complicated configuration of a programmable circuit and more complicated connection between the unit cells can be easily achieved.

As described above, the programmable circuit in this embodiment includes a plurality of unit cells 320 each including the first to fourth transistors as the switches, and the output of each unit cell 320 can switch between a conducting state, a non-conducting state, and a conducting state through the analog element 310 by controlling the potential of the first node FG1 (where the first transistor 340 and the second transistor 350 are connected) and the potential of the second node FG2 (where the third transistor 342 and the fourth transistor 352 are connected). Thus, an analog value synthesized by the programmable circuit can be varied along with the outputs of the unit cells, and the circuit can be optimized by adjusting the analog value. A versatile programmable circuit can be provided as a result.

With the use of transistors including a wide bandgap semiconductor (e.g., an oxide semiconductor) with sufficiently low off-state current as the first transistor 340 and the third transistor 342 included in the unit cell 320, data for switching the output of the unit cell 320 can be held for a long time even while supply of the power supply potential is interrupted. Consequently, power consumption can be reduced. In addition, since data for switching the output of the unit cell 320 is held, the data does not need to be rewritten when the power supply potential is supplied again; therefore, the start time of the programmable circuit after power on can be shortened as compared to the case of using volatile memory.

Further, unlike the case where a floating gate is used in memory unit and data is written with electron injection, high voltage for injecting charge is not necessary because the unit cell 320 included in the programmable circuit in this embodiment is controlled by switching of the transistor 340 including a wide bandgap semiconductor such as an oxide semiconductor. Moreover, a gate insulating layer is not deteriorated by tunneling current, which is generated when electrons are injected into a floating gate; therefore, the data rewrite cycles can be increased.

The configurations, methods, and the like described in this embodiment can be combined as appropriate with any of the configurations, methods, and the like described in the other embodiments.

Embodiment 2

In this embodiment, an application example of the programmable circuit 332 in Embodiment 1 will be described. Needless to say, an analog element described in this embodiment can be applied to the programmable circuit 330. Further, an analog element other than that described in this embodiment can be applied to the programmable circuit according to one embodiment of the present invention.

Figure 5A:
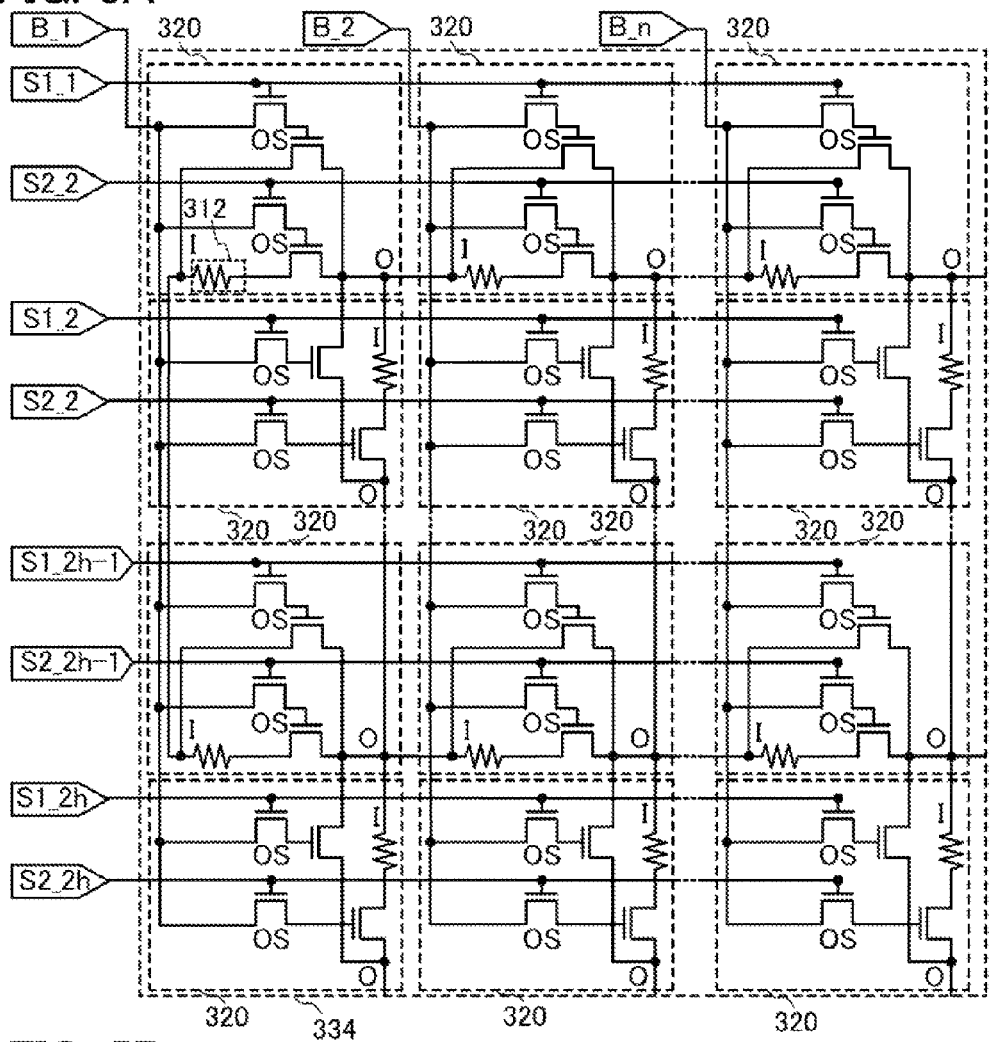
FIGS. 5A and 5B are circuit diagrams each illustrating a semiconductor device according to one embodiment of the present invention.

FIG. 5A illustrates an example where the programmable circuit 332 in FIG. 4 is applied to a ladder resistor circuit. A programmable circuit 334 illustrated in FIG. 5A includes a resistor 312 as the analog element 310 included in the unit cell 320.

In the programmable circuit 334 in FIG. 5A, the output of the unit cell can switch between a conducting state, a non-conducting state, and a conducting state through the resistor 312 by controlling the potential of the first node FG1 (where the first transistor 340 and the second transistor 350 are connected) and the potential of the second node FG2 (where the third transistor 342 and the fourth transistor 352 are connected) in the unit cell 320. Thus, the circuit can be optimized by adjusting the resistance value. Note that the number of the unit cells 320 included in the programmable circuit 334 is preferably larger because the larger the number of the unit cells 320, the more various the resistance values that the programmable circuit can synthesize.

Figure 5B:
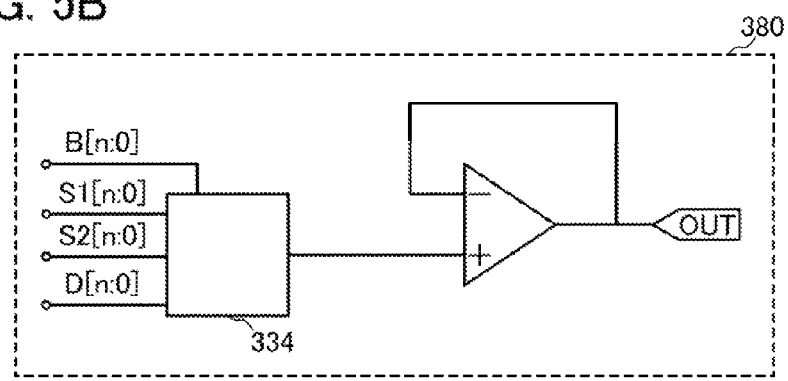

The programmable circuit 334 can be used as part of a D/A converter 380 as illustrated in FIG. 5B, for example. With the use of the programmable circuit 334 as part of the D/A converter 380, fine adjustment of the resistance value of the D/A converter 380 can be performed in a programmable way. As a result, the versatility of a semiconductor device including the D/A converter 380 can be increased.

In the D/A converter 380 described in this embodiment, a resistance value output from the programmable circuit 334 can be changed by switching of the output from the unit cell 320, so that the resolution of the D/A converter 380 can be changed easily and accurately. Further, the increase in the number of the unit cells 320 included in the programmable circuit 334 can increase the number of bits, so that the resolution of the D/A converter 380 can be increased. Thus, the semiconductor device including the D/A converter 380 can be sophisticated.

With the use of transistors including a wide bandgap semiconductor (e.g., an oxide semiconductor) with sufficiently low off-state current as the first transistor 340 and the third transistor 342 included in the unit cell 320, data for switching the output of the unit cell 320 can be held for a long time even while supply of the power supply potential is interrupted. Consequently, power consumption of the semiconductor device can be reduced.

In addition, the resistor included in the programmable circuit 334 preferably includes a semiconductor material similar to that used for the first transistor 340 and the like (e.g., an oxide semiconductor), in which case the process of manufacturing the programmable circuit 334 can be simplified and the manufacturing time can be shortened. Thus, the costs for manufacturing the semiconductor device can be reduced. Further, semiconductor materials included in the first to fourth transistors and the resistor may be the same.

The configurations, methods, and the like described in this embodiment can be combined as appropriate with any of the configurations, methods, and the like described in the other embodiments.

Embodiment 3

In this embodiment, a method for manufacturing transistors included in the programmable circuit in Embodiment 1 or Embodiment 2 will be described with reference to FIGS. 6A to 6D, FIGS. 7A and 7B, FIGS. 8A to 8C, and FIGS. 9A and 9B. In this embodiment, a method for manufacturing a transistor 110 including an oxide semiconductor (hereinafter also referred to as an oxide semiconductor transistor) and an n-channel transistor 112 is specifically described as an example. Note that the oxide semiconductor transistor 110 corresponds to the first transistor 340 in FIG. 1, and the n-channel transistor 112 corresponds to the second transistor 350 in FIG. 1. In FIGS. 6A to 6D, FIGS. 7A and 7B, FIGS. 8A to 8C, and FIGS. 9A and 9B, the cross section along A-B is a cross-sectional view of a region where the oxide semiconductor transistor 110 and the n-channel transistor 112 are formed, and the cross section along C-D is a cross-sectional view of a node FG where one of a source electrode and a drain electrode of the oxide semiconductor transistor 110 and a gate electrode of the n-channel transistor 112 are connected to each other.

Figure 6A:
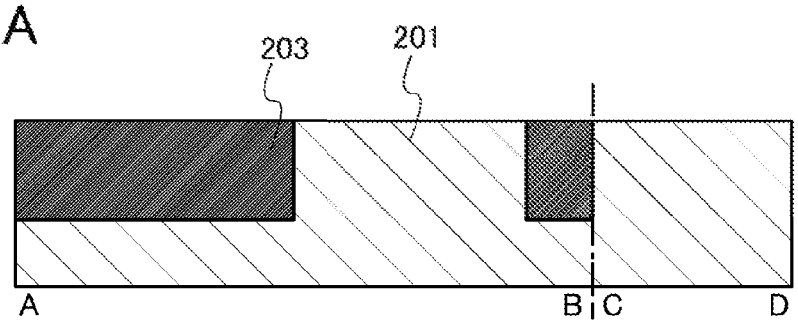
FIGS. 6A to 6D illustrate steps of forming a programmable circuit.

First, as illustrated in FIG. 6A, element isolation regions 203 are formed in a p-type semiconductor substrate 201.

Examples of the p-type semiconductor substrate 201 are a single crystal silicon substrate (a silicon wafer) having p-type conductivity and a compound semiconductor substrate (e.g., a SiC substrate, a sapphire substrate, and a GaN substrate).

Instead of the p-type semiconductor substrate 201, the following SOI (silicon on insulator) substrate may be used: an SIMOX (separation by implanted oxygen) substrate which is formed in such a manner that oxygen ions are implanted into a mirror-polished wafer, and then high-temperature heating is performed to form an oxide layer at a certain depth from the surface and to eliminate defects generated in a surface layer; an SOI substrate formed by a Smart-Cut method in which a semiconductor substrate is cleaved by utilizing growth of minute voids, which are formed by implantation of hydrogen ions, by thermal treatment; or an SOI substrate formed by an ELTRAN (epitaxial layer transfer: a registered trademark of Canon Inc.) method or the like.

The element isolation regions 203 are formed by a LOCOS (local oxidation of silicon) method, an STI (shallow trench isolation) method, or the like.

When a p-channel transistor is formed over the same substrate as the oxide semiconductor transistor 110 and the n-channel transistor 112, for example, when a p-channel transistor and an inverter are formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Figure 6B:
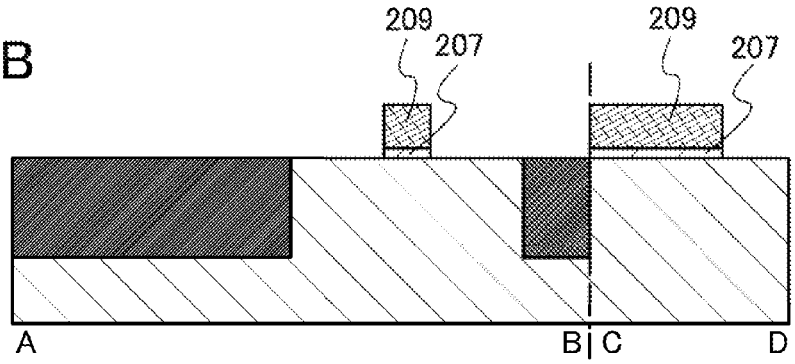

Next, as illustrated in FIG. 6B, a gate insulating film 207 and a gate electrode 209 are formed over the semiconductor substrate 201.

Heat treatment is performed to oxidize a surface of the semiconductor substrate 201, thereby forming a silicon oxide film. Alternatively, a stack of a silicon oxide film and a silicon film containing oxygen and nitrogen (silicon oxynitride film) may be formed in such a manner that the silicon oxide film is formed by thermal oxidation and then nitridation treatment is performed to nitride a surface of the silicon oxide film. Next, part of the silicon oxide film or part of the silicon oxynitride film is selectively etched, thereby forming the gate insulating film 207. Alternatively, the gate insulating film 207 is formed in the following manner: a film with a thickness of 5 nm to 50 nm is formed by CVD, sputtering, or the like using silicon oxide, silicon oxynitride, or a high dielectric constant material (high-k material), for example, metal oxide such as tantalum oxide, hafnium oxide, zirconium oxide, aluminum oxide, or titanium oxide, rare earth oxide such as lanthanum oxide, or hafnium silicate and then part of the film is selectively etched.

The gate electrode 209 is preferably formed using a metal such as tantalum, tungsten, titanium, molybdenum, chromium, or niobium or an alloy material or a compound material containing any of the metals as its main component. Further, polycrystalline silicon to which an impurity element such as phosphorus is added can be used. Alternatively, the gate electrode 209 may be a stack of a metal nitride film and a film of any of the above metals. As metal nitride, tungsten nitride, molybdenum nitride, or titanium nitride can be used. The provision of the metal nitride film can increase the adhesiveness of the metal film and thus can prevent the metal film from being separated from the gate insulating film 207.

The gate electrode 209 is formed in such a manner that a conductive film is formed by sputtering, CVD, or the like and then part of the conductive film is selectively etched.

Here, a silicon oxide film is formed by performing heat treatment to oxidize a surface of the semiconductor substrate 201, a conductive film in which a tantalum nitride film and a tungsten film are stacked is formed over the silicon oxide film by sputtering, and then, part of the silicon oxide film and part of the conductive film are selectively etched, thereby forming the gate insulating film 207 and the gate electrode 209.

Note that in terms of higher integration, it is preferable that a sidewall insulating layer be not provided on a side surface of the gate electrode 209. On the other hand, a sidewall insulating layer can be provided on a side surface of the gate electrode 209 if a priority is given to characteristics of a transistor.

Figure 6C:
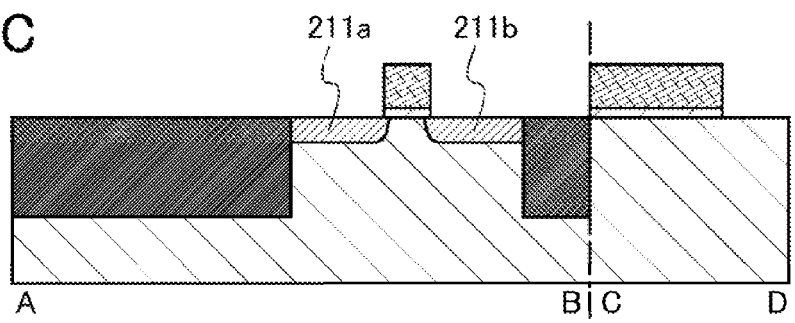

Next, as illustrated in FIG. 6C, an impurity element imparting n-type conductivity is added to the semiconductor substrate 201 to form n-type impurity regions 211a and 211b. In the case where an n-well region is formed in the semiconductor substrate 201, an impurity element imparting p-type conductivity is added to the n-well region to form p-type impurity regions. The concentration of the impurity element imparting n-type conductivity in the n-type impurity regions 211a and 211b and the concentration of the impurity element imparting p-type conductivity in the p-type impurity regions range from $1\times10^{19}/cm^3$ to $1\times10^{21}/cm^3$. The impurity element imparting n-type conductivity and the impurity element imparting p-type conductivity are added to the semiconductor substrate 201 and the n-well region, respectively, by ion doping, ion implantation, or the like as appropriate.

In the case where a sidewall insulating layer is provided on a side surface of the gate electrode 209, an impurity region having an impurity concentration different from those of the n-type impurity regions 211a and 211b and the p-type impurity regions can be formed in a region overlapping with the sidewall insulating layer.

Figure 6D:
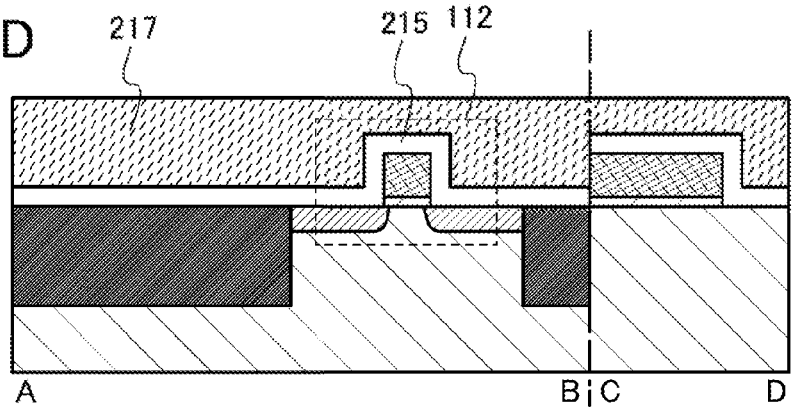

Next, as illustrated in FIG. 6D, an insulating film 215 and an insulating film 217 are formed over the semiconductor substrate 201, the element isolation regions 203, the gate insulating film 207, and the gate electrode 209 by sputtering, CVD, or the like.

The insulating films 215 and 217 are each formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by CVD, a hydrogen content of the insulating film 215 is increased. When such an insulating film 215 is used and heat treatment is performed, the semiconductor substrate is hydrogenated and dangling bonds are terminated by hydrogen, so that defects in the semiconductor substrate can be reduced.

The planarity of the insulating film 217 can be high when the insulating film 217 is formed using an inorganic material such as boron phosphorus silicon glass (BPSG) or an organic material such as polyimide or acrylic.

After the insulating film 215 or the insulating film 217 is formed, heat treatment is performed in order to activate the impurity elements added to the n-type impurity regions 211a and 211b and the p-type impurity regions.

Through the above-described steps, the n-channel transistor 112 can be fabricated as illustrated in FIG. 6D.

Next, parts of the insulating films 215 and 217 are selectively etched to form openings. Then, a contact plug 219a and a contact plug 219b are formed in the openings. Typically, a conductive film is formed by sputtering, CVD, or the like and then subjected to planarization treatment such as chemical mechanical polishing (CMP) or etching so that an unnecessary portion of a surface of the conductive film is removed, thereby forming the contact plugs.

The conductive film serving as the contact plugs 219a and 219b is formed by depositing tungsten silicide in the openings by CVD using a $WF_6$ gas and a $SiH_4$ gas.

Next, an insulating film is formed over the insulating film 217 and the contact plugs 219a and 219b by sputtering, CVD, or the like, and after that, part of the insulating film is selectively etched to form an insulating film 221 having a groove. Subsequently, a conductive film is formed by sputtering, CVD, or the like and then subjected to planarization treatment such as CMP or etching so that an unnecessary portion of a surface of the conductive film is removed, thereby forming a wiring 223a and a wiring 223b (see FIG. 7A).

Here, the wirings 223a and 223b function as a source electrode and a drain electrode of the transistor 112. One of the wirings 223a and 223b is electrically connected to one electrode of the analog element 310 illustrated in FIG. 1, and the other thereof is electrically connected to the output signal line OUT illustrated in FIG. 1.

The insulating film 221 can be formed using a material similar to that for the insulating film 215.

The wirings 223a and 223b are formed with a single layer or a stack containing a metal such as aluminum, titanium, chromium, nickel, copper, yttrium, zirconium, molybdenum, silver, tantalum, or tungsten or an alloy containing any of these metals as a main component. For example, the wirings 223a and 223b have a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, or a three-layer structure in which a titanium film, an aluminum film, and a titanium film are stacked in this order. Note that a transparent conductive material containing indium oxide, tin oxide, or zinc oxide may be used.

With the use of the planarized insulating film 221 and wirings 223a and 223b, variations in electric characteristics of oxide semiconductor transistors to be fabricated later can be reduced, and the oxide semiconductor transistors can be fabricated at high yield.

Then, hydrogen contained in the insulating film 221 and the wirings 223a and 223b is preferably eliminated by heat treatment or plasma treatment. Consequently, in heat treatment performed later, diffusion of hydrogen into an insulating film and an oxide semiconductor film which are formed later can be prevented. The heat treatment is performed at a temperature higher than or equal to 100° C. and lower than the strain point of the substrate in an inert atmosphere, a reduced-pressure atmosphere, or a dry air atmosphere. Further, for the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating film 221 and the wirings 223a and 223b by sputtering, CVD, or the like. The insulating film 225 is formed with a single layer or a stack containing silicon oxide, silicon oxynitride, silicon nitride oxide, gallium oxide, hafnium oxide, yttrium oxide, aluminum oxide, and/or aluminum oxynitride. Moreover, the insulating film 225 is preferably formed using an oxide insulating film from which some contained oxygen is released by heating. The oxide insulating film from which some contained oxygen is released by heating is an oxide insulating film that contains oxygen at a proportion exceeding the stoichiometric proportion. Since oxygen is released from such an oxide insulating film by heating, oxygen can be diffused into the oxide semiconductor film by heat treatment performed later.

The insulating film 225 is preferably planarized by CMP treatment or the like. The average surface roughness ($R_a$) of a surface of the insulating film 225 is 1 nm or less, preferably 0.3 nm or less, further preferably 0.1 nm or less.

In this specification and the like, the average surface roughness ($R_a$) is obtained by three-dimension expansion of center line average surface roughness ($R_a$) which is defined by JISB0601:2001 (ISO 4287:1997) so that $R_a$ can be applied to a measurement surface, and is an average value of the absolute values of deviations from a reference surface to a specific surface.

When the measurement surface which is a surface represented by measurement data is expressed by Z=F(X,Y), the average surface roughness ($R_a$) is an average value of the absolute values of deviations from the reference surface to the specific surface and is expressed by Formula 1.

$$R_a = \frac{1}{S_0} \int_{Y_1}^{y_2} \int_{X_1}^{x_2} |F(X,Y) - Z_0| dX dY \qquad \text{[Formula 1]}$$

Here, the specific surface is a surface which is a target of roughness measurement, and is a quadrangular region represented by four points $(X_1, Y_1)$, $(X_1, Y_2)$, $(X_2, Y_1)$, and $(X_2, Y_2)$. Moreover, $S_0$ represents the area of the specific surface when the specific surface is flat ideally. The reference surface refers to a surface parallel to an X—Y surface at the average height of the specific surface. That is, when the average value of the height of the specific surface is denoted by $Z_0$, the height of the reference surface is also denoted by $Z_0$. The average surface roughness ($R_a$) can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the flatness of the surface of the insulating film 225 can be further increased.

Alternatively, the insulating film 225 can be planarized by plasma treatment. The plasma treatment is performed in such a manner that an inert gas, for example, a rare gas such as an argon gas is introduced into a vacuum chamber and an electric field is applied so that a surface to be processed serves as a cathode. The plasma treatment has the same principle as a plasma dry etching method, except that an inert gas is used in the plasma treatment. In other words, in the plasma treatment, the surface to be processed is irradiated with ions of an inert gas and minute unevenness of the surface is reduced by a sputtering effect. Accordingly, the plasma treatment can be called reverse sputtering treatment.

When the plasma treatment is performed, electrons and argon cations are present in plasma and the argon cations are accelerated in the cathode direction. The surface to be processed is sputtered by the accelerated argon cations. At that time, a projected portion of the surface is preferentially sputtered. Particles ejected from the surface attach to another place of the surface. At that time, the particles ejected from the surface preferentially attach to a recessed portion of the surface. By thus reducing the projected portion and filling the recessed portion, the planarity of the surface is increased. Note that the use of the plasma treatment and the CMP treatment in combination can further increase the planarity of the insulating film 225.

Note that through the plasma treatment, it is possible to remove impurities, such as oxygen, moisture, and an organic compound, attached onto the surface of the insulating film 225 by a sputtering effect.

Note that before the deposition of the oxide semiconductor film, it is preferable that a deposition chamber be heated and evacuated to remove impurities, such as hydrogen, water, a hydroxyl group, and hydride, in the deposition chamber. It is particularly important to remove the impurities absorbed on an inner wall of the deposition chamber. Here, heat treatment may be performed at 100° C. to 450° C., for example. The deposition chamber is preferably evacuated with a rough vacuum pump such as a dry pump and a high vacuum pump such as a sputter ion pump, a turbo molecular pump, or a cryopump in appropriate combination. The turbo molecular pump has an outstanding capability of evacuating large-sized molecules, whereas it has a low capability of evacuating hydrogen or water. Furthermore, it is effective to use a combination of the turbo molecular pump and a cryopump having a high capability of evacuating water or a sputter ion pump having a high capability of evacuating hydrogen. At this time, when impurities are removed while an inert gas is introduced, the rate of elimination of water or the like, which is difficult to eliminate only by evacuation, can be further increased. By removing impurities in the deposition chamber by such treatment before the deposition of the oxide semiconductor film, mixture of hydrogen, water, a hydroxyl group, hydride, and the like into the oxide semiconductor can be reduced.

In addition, before the oxide semiconductor film is formed by a sputtering apparatus, a dummy substrate may be put into the sputtering apparatus, and an oxide semiconductor film may be formed over the dummy substrate to remove hydrogen and moisture attached to the target surface or a deposition shield.

Figure 7A:
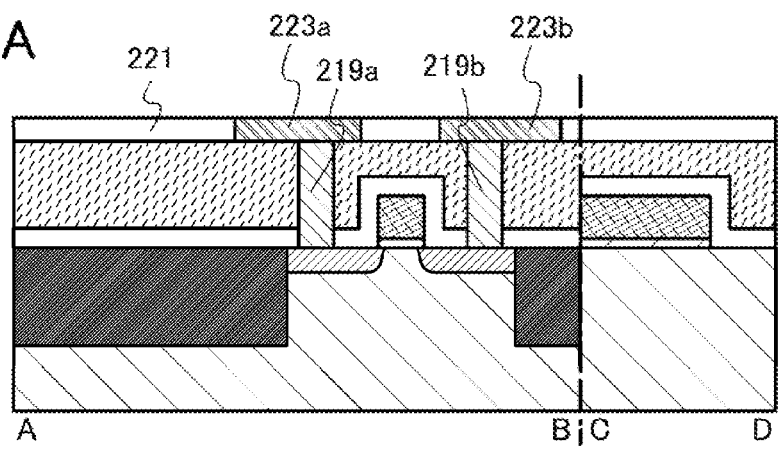
FIGS. 7A and 7B illustrate steps of forming a programmable circuit.
Figure 7B:
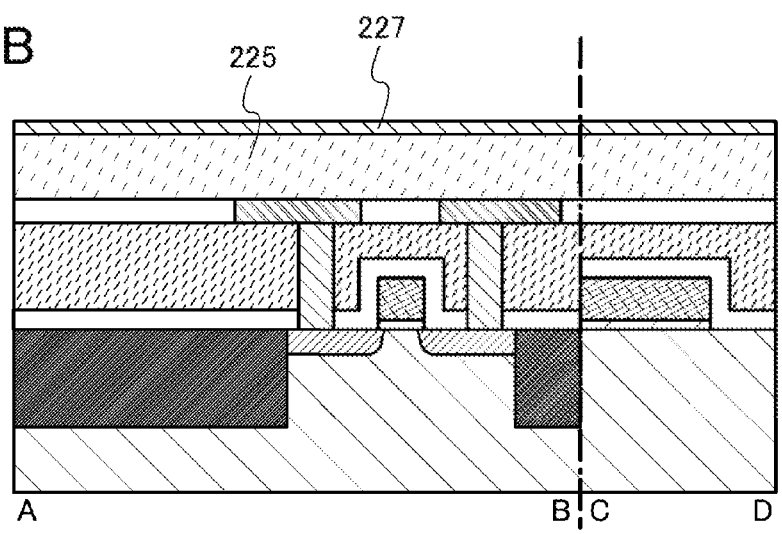

Next, an oxide semiconductor film 227 is formed over the insulating film 225 by sputtering, coating, printing, evaporation, PCVD, PLD, ALD, MBE, or the like (see FIG. 7B). Here, the oxide semiconductor film 227 is formed to a thickness of 1 nm to 50 nm, preferably 3 nm to 20 nm by sputtering. With the oxide semiconductor film 227 having a thickness in the above range, a short-channel effect which might occur due to miniaturization of the transistor can be suppressed.

An oxide semiconductor used for the oxide semiconductor film 227 preferably contains at least indium (In) or zinc (Zn). In particular, the oxide semiconductor preferably contains In and Zn. As a stabilizer for reducing variations in electric characteristics of transistors using the oxide semiconductor, the oxide semiconductor preferably contains gallium (Ga), tin (Sn), hafnium (Hf), and/or aluminum (Al) in addition to In and Zn.

As another stabilizer, the oxide semiconductor may contain one or plural kinds of lanthanoid such as lanthanum (La), cerium (Cc), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, any of the following oxides can be used, for example: indium oxide; tin oxide; zinc oxide; two-component metal oxide such as In—Zn-based oxide, Sn—Zn-based oxide, Al—Zn-based oxide, Zn—Mg-based oxide. Sn—Mg-based oxide, In—Mg-based oxide, and In—Ga-based oxide; three-component metal oxide such as In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide. In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; and four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide. Moreover, silicon oxide may be included in the above oxide semiconductor. Here, for example, an In—Ga—Zn-based oxide means an oxide containing indium (In), gallium (Ga), and zinc (Zn) as its main components and there is no particular limitation on the composition ratio. The In—Ga—Zn-based oxide may contain a metal element other than In, Ga, and Zn. Here, the amount of oxygen in the above oxide semiconductor preferably exceeds the stoichiometric proportion of oxygen. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0 and m is not an integer) may be used as the oxide semiconductor. Note that M represents one or more metal elements selected from Ga, Fe, Mn, and Co. Alternatively, as the oxide semiconductor, a material expressed by $In_3SnO_5(ZnO)_n$ (n>0 and n is an integer) may be used.

The concentration of alkali metals or alkaline earth metals in the oxide semiconductor film 227 is preferably lower than or equal to $1 \times 10^{18}$ atoms/cm$^3$, further preferably lower than or equal to $2 \times 10^{16}$ atoms/cm$^3$. This is because carriers might be generated when an alkali metal or an alkaline earth metal is bonded to an oxide semiconductor, which causes an increase in the off-state current of the transistor.

The oxide semiconductor film 227 may contain nitrogen at a concentration of $5 \times 10^{18}$ atoms/cm$^3$ or lower.

The oxide semiconductor that can be used for the oxide semiconductor film 227 is a wide bandgap semiconductor, which has a wider bandgap and a lower intrinsic carrier density than a silicon semiconductor. The off-state current of the transistor can be reduced by using an oxide semiconductor with a wide energy gap.

The oxide semiconductor film 227 may have a single crystal structure or a non-single-crystal structure. In the latter case, the oxide semiconductor film 227 may have an amorphous structure or a polycrystalline structure. Further, the oxide semiconductor film 227 may have an amorphous structure including a portion having crystallinity or a non-amorphous structure.

An oxide semiconductor in an amorphous state can have a flat surface with relative ease; thus, when a transistor is fabricated using the oxide semiconductor, interface scattering can be reduced and relatively high mobility can be obtained with relative ease.

In an oxide semiconductor having crystallinity, defects in the bulk can be further reduced, and when the surface flatness is increased, mobility higher than that of an oxide semiconductor in an amorphous state can be obtained. In order to increase the surface flatness, the oxide semiconductor is preferably formed on a flat surface. As described above, the oxide semiconductor film 227 is preferably formed over a surface of the insulating film 225 with the average surface roughness ($R_a$) of 1 nm or less, preferably 0.3 nm or less, further preferably 0.1 nm or less.

Here, the oxide semiconductor film 227 is formed by sputtering.

As a sputtering target, any of the following oxides can be used, for example: indium oxide; tin oxide; zinc oxide; two-component metal oxide such as In—Zn-based oxide, Sn—Zn-based oxide, Al—Zn-based oxide, Zn—Mg-based oxide, Sn—Mg-based oxide, In—Mg-based oxide, and In—Ga-based oxide; three-component metal oxide such as In—Ga—Zn-based oxide (IGZO), In—Al—Zn-based oxide, In—Sn—Zn-based oxide, Sn—Ga—Zn-based oxide, Al—Ga—Zn-based oxide, Sn—Al—Zn-based oxide. In—Hf—Zn-based oxide, In—La—Zn-based oxide, In—Ce—Zn-based oxide, In—Pr—Zn-based oxide. In—Nd—Zn-based oxide, In—Sm—Zn-based oxide, In—Eu—Zn-based oxide, In—Gd—Zn-based oxide, In—Tb—Zn-based oxide, In—Dy—Zn-based oxide. In—Ho—Zn-based oxide, In—Er—Zn-based oxide, In—Tm—Zn-based oxide, In—Yb—Zn-based oxide, and In—Lu—Zn-based oxide; and four-component metal oxide such as In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

When an In—Ga—Zn—O-based material is used as the oxide semiconductor, metal elements included in the target can have an atomic ratio of In:Ga:Zn=1:1:1, 4:2:3, 3:1:2, 1:1:2, 2:1:3, or 3:1:4, for example. An In—Ga—Zn-based oxide with such an atomic ratio or an oxide whose composition is in the neighborhood of the above compositions can be used as the target. With the target with the above composition ratio, a polycrystalline film or a CAAC-OS film described later is likely to be formed.

When an In—Sn—Zn—O-based material is used as the oxide semiconductor, metal elements included in a target having an atomic ratio of In:Sn:Zn=1:1:1, 2:1:3, 1:2:2, or 20:45:35, for example, is used. An In—Sn—Zn-based oxide with such an atomic ratio or an oxide whose composition is in the neighborhood of the above compositions can be used as the target. With the target with the above composition ratio, a polycrystalline film or a CAAC-OS film described later is likely to be formed.

When an In—Zn—O-based material is used as the oxide semiconductor, metal elements included in a target has an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=15:1 to 1.5:1 ($In_2O_3$:ZnO=15:2 to 3:4 in a molar ratio). For example, in a target used for forming an In—Zn-based oxide semiconductor that has an atomic ratio of In:Zn:O=X:Y:Z, the relation of Z>1.5X+Y is satisfied. An In—Zn-based oxide with such an atomic ratio or an oxide whose composition is in the neighborhood of the above compositions can be used as the target.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the interatomic distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio. In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

As a sputtering gas, a rare gas (typically argon) atmosphere, an oxygen atmosphere, or a mixed gas of a rare gas and oxygen is used as appropriate. In the case of using the mixed gas of a rare gas and oxygen, the proportion of oxygen is preferably higher than that of the rare gas. Further, in order to prevent hydrogen, water, a hydroxyl group, hydride, and the like from entering the oxide semiconductor film, the sputtering gas is preferably an atmosphere of a high-purity gas from which impurities such as hydrogen, water, a hydroxyl group, and hydride are sufficiently removed.

For sputtering, an RF power supply device, an AC power supply device, a DC power supply device, or the like can be used as appropriate as a power supply device for generating plasma.

Note that the leakage rate of a treatment chamber in which the oxide semiconductor film is formed is preferably lower than or equal to $1 \times 10^{-10}$ Pa·m$^3$/s, whereby entry of impurities into the film to be formed by sputtering can be decreased. As described above, in the process of forming the oxide semiconductor film and preferably in the process of forming the oxide insulating film, entry of impurities is suppressed as much as possible through control of the pressure of the treatment chamber, the leakage rate of the treatment chamber, and the like, whereby entry of impurities such as hydrogen into the oxide semiconductor film can be reduced. In addition, diffusion of impurities such as hydrogen from the oxide insulating film to the oxide semiconductor film can be reduced.

As the oxide semiconductor film 227, a c-axis aligned crystalline oxide semiconductor (CAAC-OS) film including crystallized parts may be used.

The CAAC-OS film is not completely single crystal nor completely amorphous. The CAAC-OS film is an oxide semiconductor film with a crystal-amorphous mixed phase structure where crystalline parts and amorphous parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, a grain boundary in the CAAC-OS film is not found with the TEM. Thus, a reduction in electron mobility due to the grain boundary is suppressed in the CAAC-OS film.

In each of the crystal parts included in the CAAC-OS film, the c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, when crystal growth occurs from a surface side of the oxide semiconductor film in the process of forming the CAAC-OS film, the proportion of crystal parts in the vicinity of the surface of the oxide semiconductor film is sometimes higher than that in the vicinity of the surface where the oxide semiconductor film is formed. Further, when an impurity or the like is added to the CAAC-OS film, the crystal part in a region to which the impurity is added becomes amorphous in some cases.

Since the c-axes of the crystal parts included in the CAAC-OS film are aligned in the direction parallel to a normal vector of the surface where the CAAC-OS film is formed or a normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the direction of c-axis of the crystal part is the direction parallel to a normal vector of the surface where the CAAC-OS film is formed or a normal vector of the surface of the CAAC-OS film. The crystal part is formed by deposition or by performing treatment for crystallization such as heat treatment after deposition.

With the use of the CAAC-OS film, the change in electric characteristics of the transistor due to irradiation with visible light or ultraviolet light can be reduced. Accordingly, a highly reliable transistor can be fabricated. Specifically, as described above, it is preferable that the average surface roughness ($R_a$) of the surface of the insulating film 225 be 1 nm or less, preferably 0.3 nm or less, further preferably 0.1 nm or less and an oxide semiconductor film including crystals whose c-axes are aligned be formed over the surface of the insulating film 225. Thus, the crystallinity of the oxide semiconductor film including the crystals whose c-axes are aligned can be increased, and the mobility of the transistor including the oxide semiconductor film can be increased.

Examples of a crystal structure of the CAAC-OS film will be described in detail with reference to FIGS. 12A to 12E, FIGS. 13A to 13C, FIGS. 14A to 14C, and FIGS. 15A and 15B. In FIGS. 12A to 12E, FIGS. 13A to 13C, FIGS. 14A to 14C, and FIGS. 15A and 15B, the vertical direction corresponds to the c-axis direction and a plane perpendicular to the c-axis direction corresponds to the a-b plane, unless otherwise specified. An "upper half" and a "lower half" refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
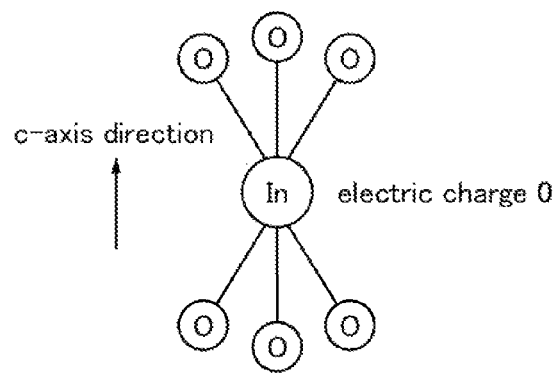
FIGS. 12A to 12E illustrate structures of an oxide material.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of the upper half and the lower half in FIG. 12A. The electric charge of the small group in FIG. 12A is 0.

Figure 12D:
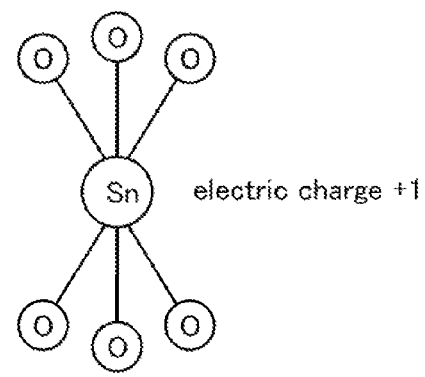
Figure 12B:
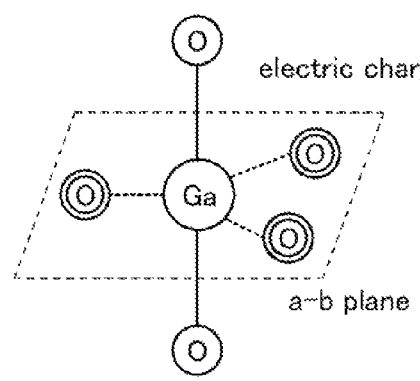

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 12B. An In atom can also have the structure illustrated in FIG. 12B because an In atom can have five ligands. The electric charge of the small group in FIG. 12B is 0.

Figure 12E:
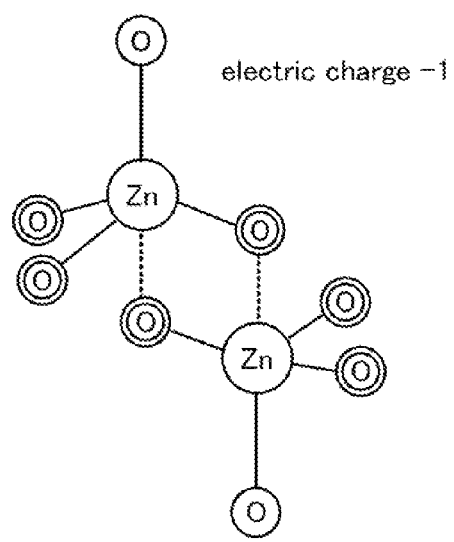
Figure 12C:
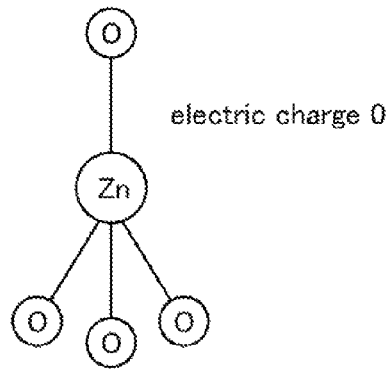

FIG. 12C illustrates a structure including one tetracoordinate Zn atom and four tetracoordinate O atoms proximate to the Zn atom. In FIG. 12C, one tetracoordinate O atom exists in the upper half and three tetracoordinate O atoms exist in the lower half. The electric charge of the small group in FIG. 12C is 0.

FIG. 12D illustrates a structure including one hexacoordinate Sn atom and six tetracoordinate O atoms proximate to the Sn atom. In FIG. 12D, three tetracoordinate O atoms exist in each of the upper half and the lower half. The electric charge of the small group in FIG. 12D is +1.

FIG. 12E illustrates a small group including two Zn atoms. In FIG. 12E, one tetracoordinate O atom exists in each of the upper half and the lower half. The electric charge of the small group in FIG. 12E is −1.

Here, a plurality of small groups form a medium group, and a plurality of medium groups form a large group.

Now, a rule of bonding between the small groups will be described. The three O atoms in the upper half with respect to the In atom each have three proximate In atoms in the downward direction, and the three O atoms in the lower half each have three proximate In atoms in the upward direction. The one O atom in the upper half with respect to the Ga atom has one proximate Ga atom in the downward direction, and the one O atom in the lower half has one proximate Ga atom in the upward direction. The one O atom in the upper half with respect to the Zn atom has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below the tetracoordinate O atoms; similarly, the number of tetracoordinate O atoms below a metal atom is equal to the number of metal atoms proximate to and above the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded to each other. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition, a medium group can be formed in a different manner by combining a plurality of small groups so that the total electric charge of the layered structure is 0.

Figure 13A:
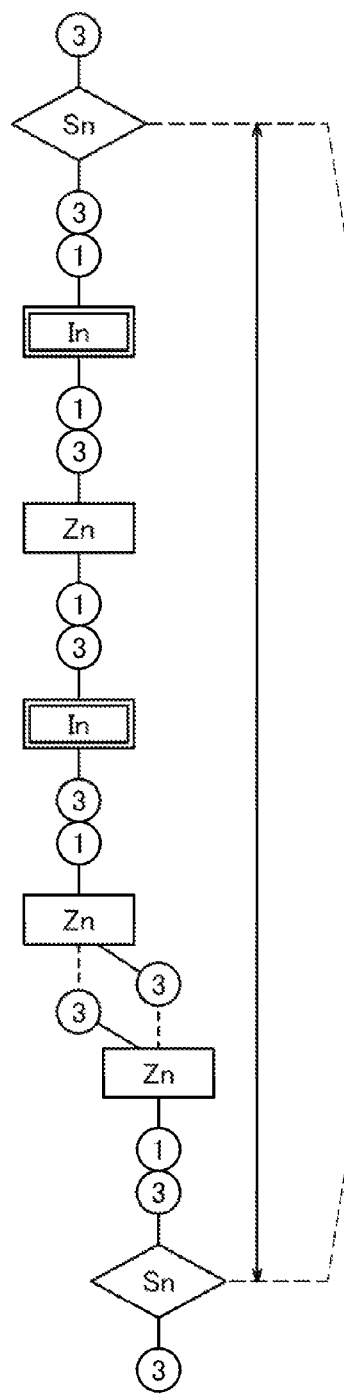
FIGS. 13A to 13C illustrate structures of an oxide material.
Figure 13B:
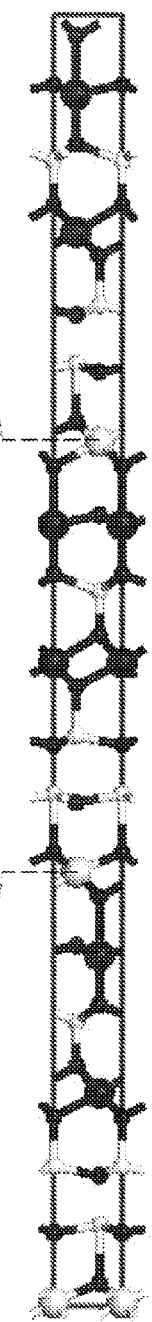
Figure 13C:

FIG. 13A illustrates a model of a medium group included in a layered structure of an In—Sn—Zn—O-based material. FIG. 13B illustrates a large group including three medium groups. Note that FIG. 13C illustrates an atomic arrangement where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom is denoted by circled 3. Similarly, in FIG. 13A, one tetracoordinate O atom existing in each of the upper half and the lower half with respect to an In atom is denoted by circled 1. FIG. 13A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 13A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate O atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups are bonded to form a large group.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

Specifically, by repeating the large group illustrated in FIG. 13B, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: four-component metal oxide such as In—Sn—Ga—Zn-based oxide; three-component metal oxide such as In—Ga—Zn-based oxide (IGZO), In—Al—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, and In—Lu—Zn-based oxide; two-component metal oxide such as an In—Zn-based oxide, Sn—Zn-based oxide, Al—Zn-based oxide, Zn—Mg-based oxide, Sn—Mg-based oxide, In—Mg-based oxide, and In—Ga-based oxide; and single-component metal oxide such as In-based oxide. Sn-based oxide, and Zn-based oxide.

Figure 14A:
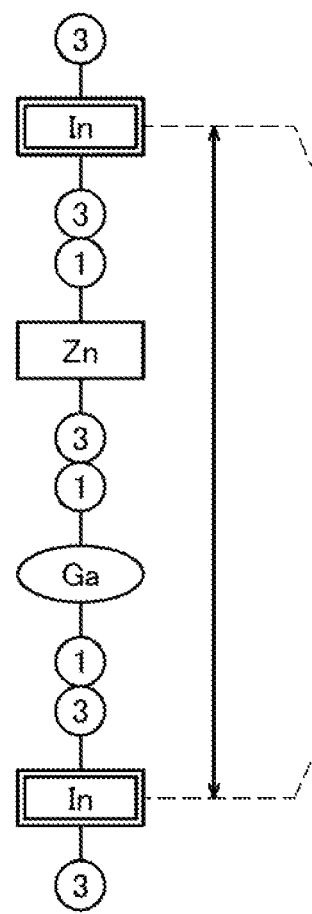
FIGS. 14A to 14C illustrate structures of an oxide material.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of the upper half and the lower half is bonded to a Zn atom proximate to one tetracoordinate O atom in the upper half, the Zn atom is bonded to a Ga atom proximate to one tetracoordinate O atom in each of the upper half and the lower half through three tetracoordinate O atoms in the lower half with respect to the Zn atom, and the Ga atom is bonded to an In atom proximate to three tetracoordinate O atoms in each of the upper half and the lower half through one tetracoordinate O atom in the lower half with respect to the Ga atom. A plurality of such medium groups are bonded to form a large group.

Figure 14B:
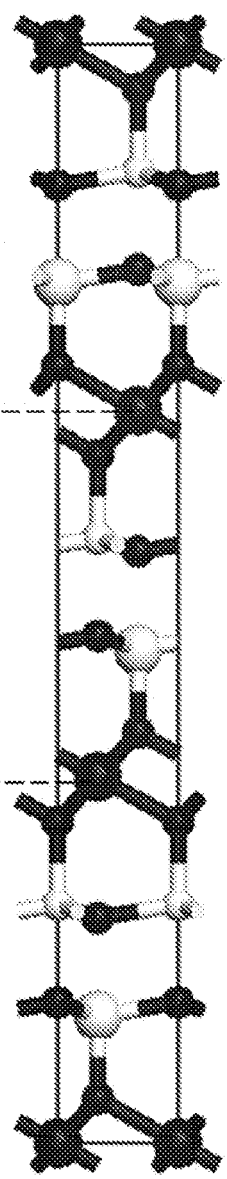
Figure 14C:
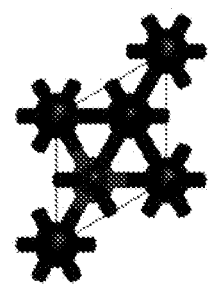

FIG. 14B illustrates a large group including three medium groups. Note that FIG. 14C illustrates an atomic arrangement where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

Specifically, by repeating the large group illustrated in FIG. 14B, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 15A:
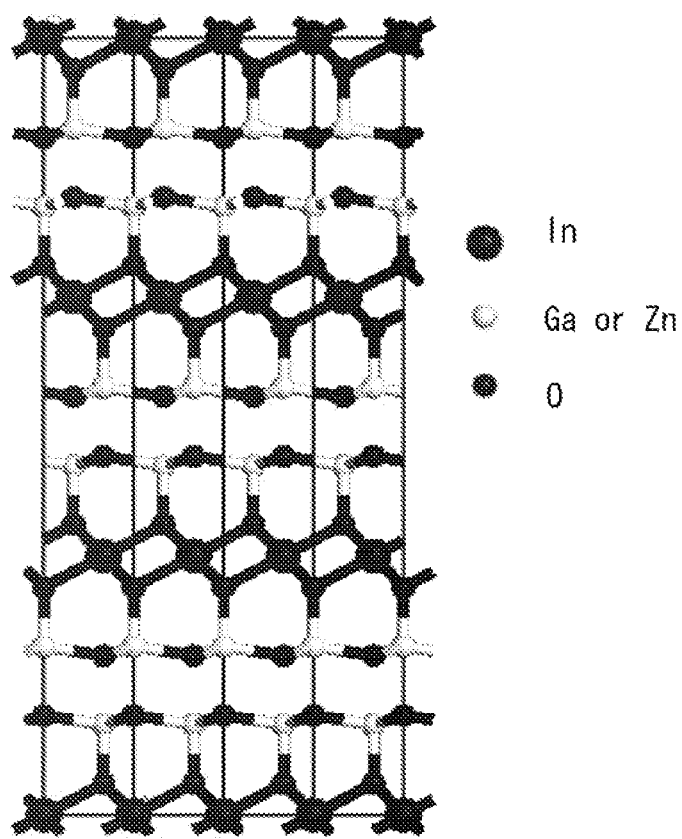
FIGS. 15A and 15B illustrate structures of oxide materials.

In the case of n=1 ($InGaZnO_4$), a crystal structure illustrated in FIG. 15A can be obtained, for example. Note that in the crystal structure in FIG. 15A, Ga can be replaced with In because a Ga atom and an In atom each have five ligands as described with reference to FIG. 12B.

Figure 15B:
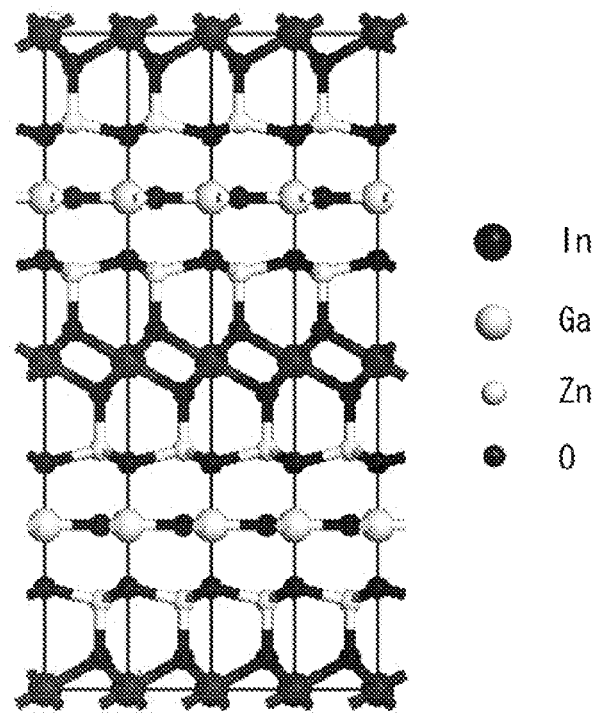

In the case of n=2 ($InGaZn_2O_5$), a crystal structure illustrated in FIG. 15B can be obtained, for example. Note that in the crystal structure in FIG. 15B, Ga can be replaced with In because a Ga atom and an In atom each have five ligands as described with reference to FIG. 12B.

In order to form the CAAC-OS film as the oxide semiconductor film 227, the substrate is heated at a temperature higher than 200° C. and lower than or equal to 700° C., preferably higher than 300° C. and lower than or equal to 500° C., further preferably higher than or equal to 400° C. and lower than or equal to 450° C. during the deposition of the oxide semiconductor film 227. The oxide semiconductor film 227 is deposited while the substrate is heated in the above manner, whereby the oxide semiconductor film 227 can be the CAAC-OS film.

Alternatively, the oxide semiconductor film 227 of the CAAC-OS film may be formed in the following manner. A first oxide semiconductor film with a small thickness, specifically in the range from the thickness of one atomic layer to 10 nm, preferably from 2 nm to 5 nm, is deposited while heating is performed in the above-described temperature range. Then, a second oxide semiconductor film with a larger thickness is deposited while heating is performed in a similar manner, thereby forming a stack of the first oxide semiconductor film and the second oxide semiconductor film.

Further, in order to make the oxide semiconductor film 227 have an amorphous structure, the substrate is not heated or the substrate is heated at a temperature lower than 200° C., preferably lower than 180° C. during the deposition of the oxide semiconductor film 227. The oxide semiconductor film 227 deposited in such a manner can have an amorphous structure.

In addition, after the oxide semiconductor film having an amorphous structure is formed in the above manner, heat treatment may be performed at 250° C. to 700° C., preferably 400° C. or higher, further preferably 500° C. or higher, still further preferably 550° C. or higher to crystallize at least part of the oxide semiconductor film having an amorphous structure, whereby the oxide semiconductor film 227 of the CAAC-OS film may be formed. Note that the heat treatment can be performed in an inert gas atmosphere. As the inert gas atmosphere, it is preferable to use an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (i.e., the impurity concentration is 1 ppm or less, preferably 0.1 ppm or less). Heat treatment for dehydration or dehydrogenation, which is described later, or the like can double as this heat treatment.

As the substrate heating temperature during the deposition is higher in the above method, the impurity concentration of the obtained oxide semiconductor film 227 is decreased. Further, the atomic arrangement in the oxide semiconductor film 227 is ordered and the density of the oxide semiconductor film 227 is increased, so that a polycrystalline film or a CAAC-OS film is likely to be formed. Furthermore, when an oxygen gas atmosphere is employed for the deposition, a polycrystalline film or a CAAC-OS film is easily formed because an unnecessary atom such as a rare gas is not contained in the oxide semiconductor film 227. Note that a mixed gas atmosphere including an oxygen gas and a rare gas may be used. In that case, the percentage of an oxygen gas is 30 vol % or higher, preferably 50 vol % or higher, further preferably 80 vol % or higher.

After the formation of the oxide semiconductor film 227, heat treatment may be performed on the oxide semiconductor film 227. The heat treatment can further remove substances containing hydrogen atoms in the oxide semiconductor film 227. The heat treatment is performed in an inert gas atmosphere at a temperature higher than or equal to 300° C. and lower than or equal to 700° C., preferably higher than or equal to 450° C. and lower than or equal to 600° C. (lower than the strain point of the substrate if the substrate has one). As the inert gas atmosphere, it is preferable to use an atmosphere that contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (i.e., the impurity concentration is 1 ppm or less, preferably 0.1 ppm or less).

For example, after the semiconductor substrate 201 is introduced into an electric furnace including a resistance heater or the like, the heat treatment can be performed at 450° C. for one hour in a nitrogen atmosphere.

The heat treatment apparatus is not limited to the electric furnace and may be an apparatus for heating an object by thermal conduction or thermal radiation from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, like nitrogen or a rare gas such as argon is used. When a GRTA apparatus is used as the heat treatment apparatus, the substrate may be heated in an inert gas heated to high temperature of 650° C. to 700° C. because the heat treatment time is short.

In addition, it is preferable that after the oxide semiconductor film 227 is heated through the heat treatment, a high-purity oxygen gas, a high-purity $N_2O$ gas, or ultra-dry air (with a moisture content of 20 ppm (−55° C. by conversion into a dew point) or less, preferably 1 ppm or less, further preferably 10 ppb or less, in the case where measurement is performed with the use of a dew point meter of a cavity ring down laser spectroscopy (CRDS) system) may be introduced into the same furnace. It is particularly preferable that water, hydrogen, and the like be not contained in these gases. The purity of the oxygen gas or the $N_2O$ gas introduced into the heat treatment apparatus is preferably 6N or higher, further preferably 7N or higher (i.e., the impurity concentration in the oxygen gas or the $N_2O$ gas is preferably 1 ppm or less, further preferably 0.1 ppm or less). By the action of the oxygen gas or the $N_2O$ gas, oxygen which is one of a main component of the oxide semiconductor and which has been reduced through the step for removing impurities by dehydration or dehydrogenation treatment can be supplied.

The above heat treatment has an effect of removing hydrogen, water, and the like and can be referred to as dehydration, dehydrogenation, or the like. The heat treatment can be performed, for example, before the oxide semiconductor film is processed into an island shape or after the gate insulating film is formed. Such heat treatment for dehydration or dehydrogenation may be conducted once or plural times.

Next, part of the oxide semiconductor film 227 is selectively etched, thereby forming an island-shaped oxide semiconductor film 229. After that, an insulating film 231 is formed over the oxide semiconductor film 229 by sputtering, CVD, or the like. Then, a gate electrode 233 is formed over the insulating film 231 (see FIG. 8A).

The insulating film 231 is formed with a single layer or a stack using, for example, one or more of silicon oxide, silicon oxynitride, silicon nitride oxide, aluminum oxide, hafnium oxide, gallium oxide, Ga—Zn-based metal oxide, and the like. The insulating film 231 may be an oxide insulating film from which oxygen is released by heating, such as a film applicable to the insulating film 225. By using a film from which oxygen is released by heating as the insulating film 231, oxygen vacancies that are formed in the oxide semiconductor film 229 by heat treatment performed later can be reduced, and deterioration in electric characteristics of the transistor can be suppressed.

The insulating film 231 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, in which case gate leakage current can be decreased even if the thickness of the gate insulating film is reduced.

The thickness of the insulating film 231 is preferably from 10 nm to 301 nm, further preferably from 5 nm to 50 nm, still further preferably from 10 nm to 30 nm.

The gate electrode 233 can be formed using a metal element selected from aluminum, chromium, copper, tantalum, titanium, molybdenum, and tungsten; an alloy containing any of these metal elements as a component; an alloy containing any of these metal elements in combination; or the like. Further, manganese and/or zirconium may be used. The gate electrode 233 may have a single-layer structure or a layered structure of two or more layers. For example, the gate electrode 233 can have a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order. Alternatively, the gate electrode 233 may be formed using a film, an alloy film, or a nitride film that contains aluminum and one or more elements selected from titanium, tantalum, tungsten, molybdenum, chromium, neodymium, and scandium.

The gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Moreover, ThE gate electrode 233 can have a layered structure using the above light-transmitting conductive material and the above metal element.

The gate electrode 233 is formed by a printing method or an inkjet method. Alternatively, the gate electrode 233 is formed in such a manner that a conductive film is formed by sputtering, CVD, evaporation, or the like and then part of the conductive film is selectively etched.

As a material layer in contact with the insulating film 231, an In—Ga—Zn—O film containing nitrogen, an In—Sn—O film containing nitrogen, an In—Ga—O film containing nitrogen, an n-Zn—O film containing nitrogen, a Sn—O film containing nitrogen, an In—O film containing nitrogen, or a film of metal nitride (such as InN or ZnN) is preferably provided between the gate electrode 233 and the insulating film 231. These films each have a work function of 5 eV or higher, preferably 5.5 eV or higher and can make the threshold voltage of the transistor positive. Accordingly, a "normally-off" switching element can be obtained. For example, in the case of using an In—Ga—Zn—O film containing nitrogen, an In—Ga—Zn—O film having a nitrogen concentration at least higher than that of the oxide semiconductor film 229, specifically, an In—Ga—Zn—O film having a nitrogen concentration of 7 at.% or higher is used.

After the formation of the insulating film 231, heat treatment may be performed in an inert gas atmosphere or an oxygen atmosphere. The heat treatment temperature is preferably 200° C. to 450° C., further preferably 250° C. to 350° C. With such heat treatment, variations in electric characteristics of transistors can be reduced. Further, in the case where the insulating film 225 or the insulating film 231, each of which is in contact with the oxide semiconductor film 229, includes oxygen, oxygen can be supplied to the oxide semiconductor film 229, and oxygen vacancies in the oxide semiconductor film 229 can be filled. As described above, the heat treatment has an effect of supplying oxygen and therefore can be called treatment for "supply of oxygen".

Note that in this embodiment, the heat treatment for supply of oxygen is performed after the insulating film 231 is formed; however, the timing of the heat treatment for supply of oxygen is not limited thereto.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurities other than main components of the oxide semiconductor film 229 as few as possible.

Figure 8A:
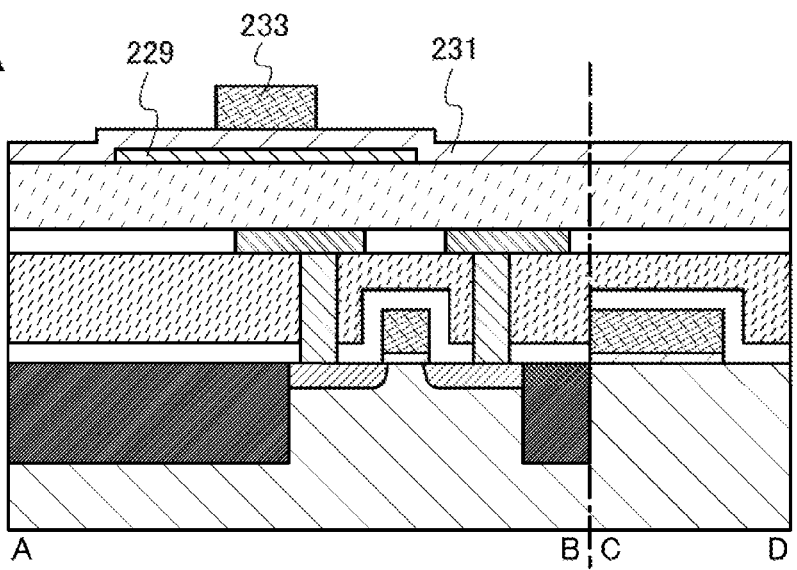
FIGS. 8A to 8C illustrate steps of forming a programmable circuit.
Figure 8B:
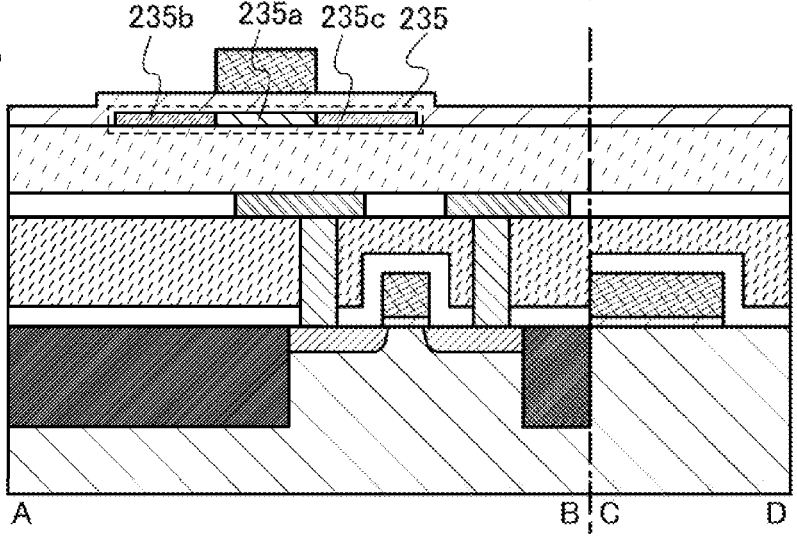

Next, a dopant may be added to the oxide semiconductor film 229 using the gate electrode 233 as a mask. In that case, a first region 235a that is covered with the gate electrode 233 and is thus not doped with the dopant, and a pair of second regions 235b and 235c containing the dopant are formed as illustrated in FIG. 8B. Since the dopant is added using the gate electrode 233 as a mask, the first region 235a to which the dopant is not added and the pair of second regions 235b and 235c containing the dopant can be formed in a self-aligned manner. Note that the first region 235a which overlaps with the gate electrode 233 functions as a channel region. The pair of second regions 235b and 235c containing the dopant functions to relax electric fields (function as "electric field relaxation regions"). The first region 235a and the pair of second regions 235b and 235c containing the dopant compose an oxide semiconductor film 235.

The hydrogen concentration of the first region 235a in the oxide semiconductor film 235 is preferably lower than $5 \times 10^{18}$ atoms/cm$^3$ more preferably $1 \times 10^{18}$ atoms/cm$^3$ or lower, further preferably $5 \times 10^{17}$ atoms/cm$^3$ or lower, still further preferably $1 \times 10^{16}$ atoms/cm$^3$ or lower. By bonding between an oxide semiconductor and hydrogen, part of contained hydrogen serves as donors to generate electrons as carriers. For that reason, the reduction in the hydrogen concentration of the first region 235a in the oxide semiconductor film 235 can suppress a negative shift of the threshold voltage.

The dopant concentration of the pair of second regions 235b and 235c is higher than or equal to $5 \times 10^{18}$ atoms/cm$^3$ and lower than or equal to $1 \times 10^{22}$ atoms/cm$^3$, preferably higher than or equal to $5 \times 10^{18}$ atoms/cm$^3$ and lower than $5 \times 10^{19}$ atoms/cm$^3$.

Since the pair of second regions 235b and 235c contains the dopant, the carrier density or the number of defects can be increased. Therefore, the conductivity of the pair of second regions 235b and 235c can be higher than that of the first region 235a which does not contain the dopant. Note that an excessive increase in the dopant concentration causes inhibition of carrier movement by the dopant, which leads to a reduction in conductivity of the pair of second regions 235b and 235c containing the dopant.

The pair of second regions 235b and 235e containing the dopant preferably has a conductivity of 0.1 S/cm to 1000 S/cm, preferably 10 S/cm to 1000 S/cm.

The existence of the pair of second regions 235b and 235c containing the dopant in the oxide semiconductor film 235 can relieve electric fields applied to an end portion of the first region 235a serving as the channel region. Thus, a short-channel effect of the transistor can be suppressed.

As a method for adding the dopant to the oxide semiconductor film 229, an ion doping method or an ion implantation method can be used. As the dopant to be added, at least one of boron, nitrogen, phosphorus, and arsenic; at least one of helium, neon, argon, krypton, and xenon; or hydrogen can be used. Alternatively, as the dopant, at least one of boron, nitrogen, phosphorus, and arsenic; at least one of helium, neon, argon, krypton, and xenon; and hydrogen may be used in combination as appropriate.

Here, the dopant is added to the oxide semiconductor film 229 in a state where the oxide semiconductor film 229 is covered with the insulating film and the like; alternatively, the dopant may be added in a state where the oxide semiconductor film 229 is exposed.

Further, the dopant can be added by a method other than injection methods such as ion doping and ion implantation. For example, a dopant can be added in the following manner: plasma is generated in an atmosphere of a gas containing an element to be added and plasma treatment is performed on an object to which the dopant is added. As an apparatus for generating plasma, a dry etching apparatus, a CVD apparatus, a high-density CVD apparatus, or the like can be used.

After that, heat treatment may be performed. The heat treatment is performed typically at a temperature of 150° C. to 450° C., preferably 250° C. to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be in either a crystalline state or an amorphous state.

Figure 8C:
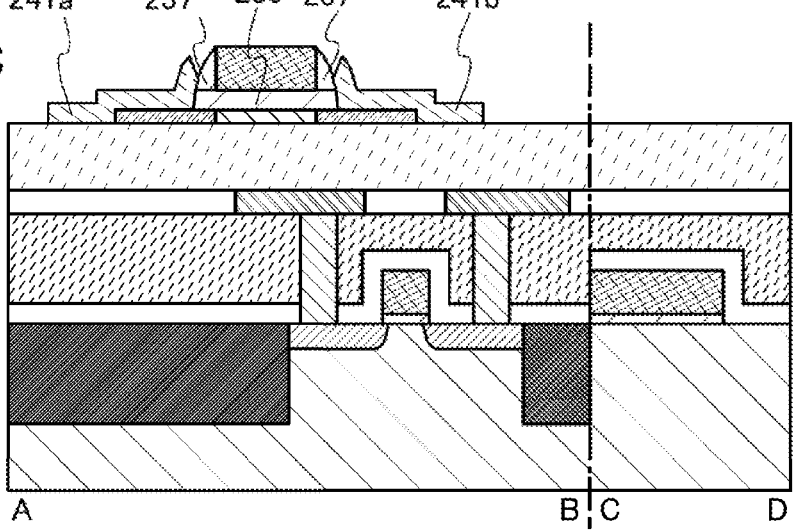

Next, as illustrated in FIG. 8C, sidewall insulating films 237 are formed on side surfaces of the gate electrode 233, and a gate insulating film 239 and electrodes 241a and 241b are formed.

The sidewall insulating films 237 are formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. Note that like the insulating film 225, the sidewall insulating films 237 may be formed using an oxide insulating film from which part of oxygen is released by heating.

A method for forming the sidewall insulating films 237 is described below.

First, an insulating film to be the sidewall insulating films 237 is formed over the insulating film 231 and the gate electrode 233. The insulating film is formed by sputtering, CVD, or the like. There is no particular limitation on the thickness of the insulating film, and the thickness is selected as appropriate so that the insulating film can cover the gate electrode 233.

Then, part of the insulating film is removed by etching, thereby forming the sidewall insulating films 237. The etching here is highly anisotropic etching, and the sidewall insulating films 237 can be formed in a self-aligned manner by performing the highly anisotropic etching on the insulating film.

The width of the electric field relaxation region in each of the pair of second regions 235b and 235c containing the dopant depends on the width of the sidewall insulating film 237, and the width of the sidewall insulating film 237 depends on the thickness of the gate electrode 233. Therefore, the thickness of the gate electrode 233 is determined so that the electric field relaxation region has a desired area.

The gate insulating film 239 can be formed by removing the insulating film 231 by highly anisotropic etching to expose the oxide semiconductor film 235 in the step of forming the sidewall insulating films 237.

The pair of electrodes 241a and 241b can be formed using a material similar to that for the wirings 223a and 223b as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by sputtering, CVD, evaporation, or the like and then part of the conductive film is selectively etched.

The pair of electrodes 241a and 241b is preferably formed to be in contact with side surfaces of the sidewall insulating films 237 and side surfaces of the gate insulating film 239. In other words, it is preferable that end portions of the pair of electrodes 241a and 241b of the transistor be located over the sidewall insulating films 237 and entirely cover exposed portions of the pair of second regions 235b and 235c containing the dopant in the oxide semiconductor film 235. Accordingly, in the pair of second regions 235b and 235c containing the dopant, regions in contact with the pair of electrodes 241a and 241b serve as a source region and a drain region, whereas regions overlapping with the sidewall insulating films 237 and the gate insulating film 239 serve as electric field relaxation regions. In addition, since the width of the electric field relaxation region can be controlled with the length of the sidewall insulating film 237, the degree of the accuracy of mask alignment for forming the pair of electrodes 241a and 241b can be lowered. Thus, variations between transistors can be reduced.

Although the sidewall insulating films 237 are provided in contact with the side surfaces of the gate electrode 233 in this embodiment, the present invention is not limited to this structure and the sidewall insulating films 237 are not necessarily provided. In addition, the sidewall insulating films 237 are provided after the formation of the pair of second regions 235b and 235c in this embodiment; however, the present invention is not limited to this, and the pair of second regions 235b and 235c may be formed after the sidewall insulating films 237 are provided. In that case, the area of the first region 235a can be increased by regions overlapping with the sidewall insulating films 237.

Figure 9A:
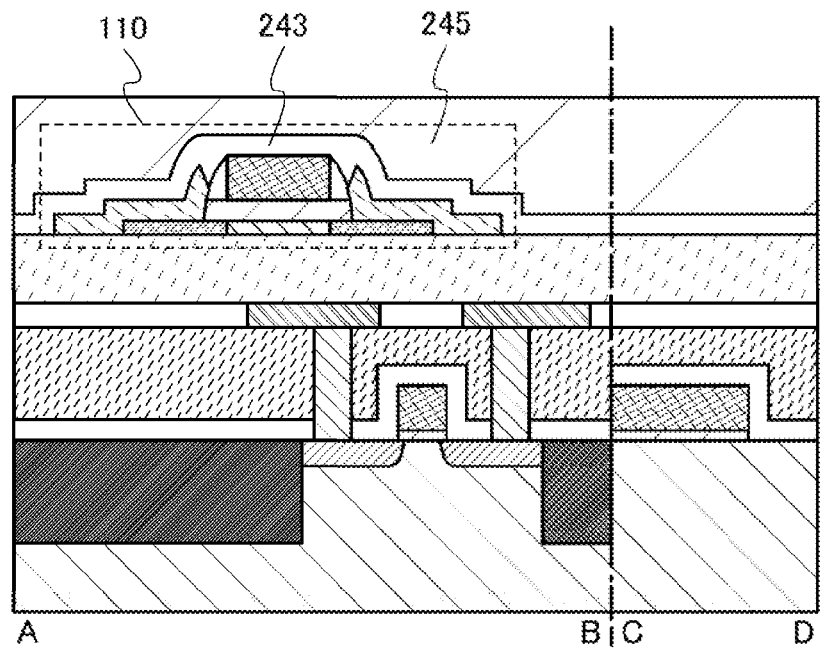
FIGS. 9A and 9B illustrate steps of forming a programmable circuit.

Next, as illustrated in FIG. 9A, an insulating film 243 and an insulating film 245 are formed by sputtering, CVD, coating, printing, or the like.

Each of the insulating films 243 and 245 is formed with a single layer or a stack using one or more of silicon oxide, silicon oxynitride, silicon nitride oxide, silicon nitride, aluminum oxide, aluminum oxynitride, aluminum nitride oxide, aluminum nitride, and the like. When an insulating film that prevents diffusion of oxygen to the outside is used as the insulating film 245, oxygen released from the insulating film 243 can be supplied to the oxide semiconductor film. Typical examples of the insulating film that prevents diffusion of oxygen to the outside are an aluminum oxide film and an aluminum oxynitride film. In addition, when an insulating film that prevents diffusion of hydrogen from the outside is used as the insulating film 245, diffusion of hydrogen from the outside to the oxide semiconductor film can be reduced, and oxygen vacancies in the oxide semiconductor film can be reduced. Typical examples of the insulating film that prevents diffusion of hydrogen from the outside are films of silicon nitride, silicon nitride oxide, aluminum nitride, and aluminum nitride oxide. Further, when the insulating film 243 has a three-layer structure in which an oxide insulating film from which part of oxygen is released by heating, an insulating film that prevents diffusion of oxygen to the outside, and an oxide insulating film are stacked, diffusion of oxygen into the oxide semiconductor film can be efficiently performed and release of oxygen to the outside can be suppressed: thus, the change in the characteristics of the transistor can be reduced even at high temperature and high humidity.

Through the above steps, the oxide semiconductor transistor 110 can be fabricated as illustrated in FIG. 9A. Note that the oxide semiconductor transistor 110 includes the oxide semiconductor film 235 which is i-type (intrinsic) or substantially i-type, and therefore has exceptional characteristics.

Note that the transistor 110 has a top-gate structure in this embodiment; however, the present invention is not limited to this and the transistor 110 may have a bottom-gate structure, for example. Further, in the transistor 110 in this embodiment, the pair of electrodes 241a and 241b is in contact with at least part of top surfaces of the pair of second regions 235b and 235c; however, the present invention is not limited to this structure, and for example, the pair of second regions 235b and 235c may be in contact with at least part of the pair of electrodes 241a and 241b. Moreover, an impurity region is not necessarily provided in the oxide semiconductor film 229.

Next, parts of the insulating films 215, 217, 221, 225, 243, and 245 are selectively etched to form openings, whereby parts of the gate electrode 209 and the electrodes 241a and 241b are exposed. Subsequently, a conductive film is formed in the openings, and then part of the conductive film is selectively etched to form a wiring 249 in contact with the electrode 241b and a wiring 250 in contact with the electrode 241a. For the wirings 249 and 250, a material for the contact plugs 219a and 219b can be used as appropriate.

Here, the wiring 249 functions as a node that electrically connects one of the source electrode and the drain electrode of the transistor 110 and the gate electrode 209 of the transistor 112. The wiring 250 functions as the other of the source electrode and the drain electrode of the transistor 110 and is electrically connected to the bit line B illustrated in FIG. 1. Although not directly shown in FIG. 9B, the gate electrode 233 of the transistor 110 is electrically connected to the word line W illustrated in FIG. 1.

Figure 9B:
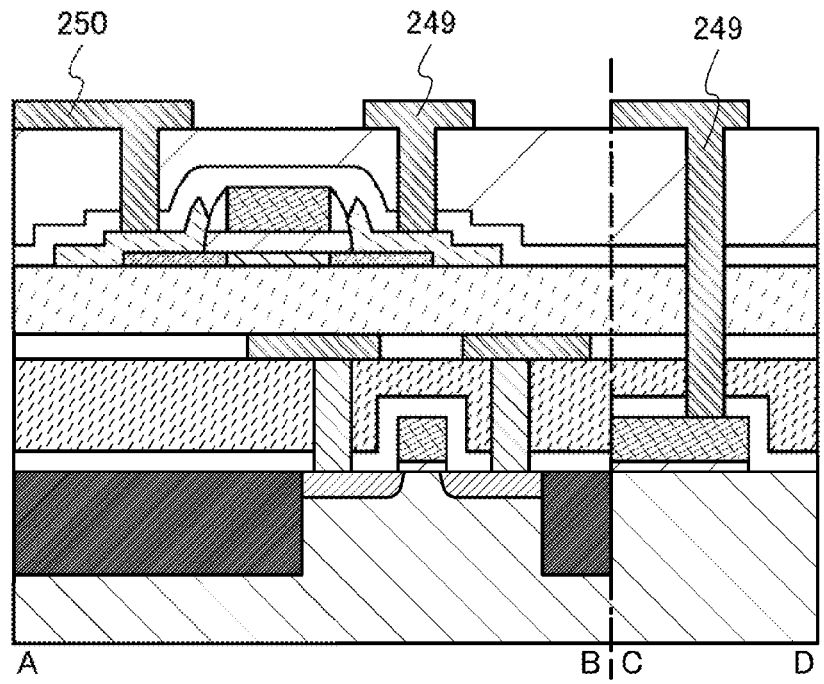

In FIG. 9B, one of the source electrode and the drain electrode (the electrode 241b) of the transistor 110 and the gate electrode 209 of the transistor 112 are connected through the wiring 249; however, this embodiment is not limited to this structure. For example, a top surface of the gate electrode of the transistor 112 may be exposed from a top surface of the insulating film provided over the transistor 112, and one of the source electrode and the drain electrode of the transistor 110 may be provided in direct contact with the top surface of the gate electrode.

Through the above steps, the transistors 110 and 112 which serve as a switch of the unit cell can be fabricated.

As has been described, the transistor including a wide bandgap semiconductor, such as an oxide semiconductor, with which the off-state current can be sufficiently low is used for a switch of the unit cell included in the programmable circuit, whereby data for switching a conducting state and a non-conducting state of the unit cell can be held for a long time even when supply of the power supply potential is interrupted. In addition, a plurality of unit cells including analog elements are provided in the programmable circuit and the state of each unit cell is switched between a conducting state and a non-conducting state, so that an analog value in the entire programmable circuit can be made variable.

The structures, methods, and the like described in this embodiment can be combined as appropriate with any of the structures, methods, and the like described in the other embodiments.

Embodiment 4

In this embodiment, the field-effect mobility of the transistor including the oxide semiconductor film described in Embodiment 3 will be derived theoretically, and the transistor characteristics will be derived from the field-effect mobility.

The actually measured field-effect mobility of an insulated gate transistor is lower than its original mobility for a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming a potential barrier (such as a grain boundary) exists in a semiconductor, the measured field-effect mobility of the semiconductor, denoted by it, is expressed by Formula 2 where the inherent field-effect mobility of the semiconductor is $\mu_0$.

$$\mu = \mu_0 \exp\left(-\frac{E}{kT}\right) \quad \text{[Formula 2]}$$

Here, E denotes the height of the potential barrier, k denotes the Boltzmann constant, and T denotes the absolute temperature. Further, on the assumption that the potential barrier is attributed to a defect, the height of the potential barrier is expressed by Formula 3 according to the Levinson model.

$$E = \frac{e^2 N^2}{8\varepsilon n} = \frac{e^3 N^2 t}{8\varepsilon C_{ox} V_g} \quad \text{[Formula 3]}$$

Here, e represents the elementary charge, N represents the average defect density per unit area in a channel, $\varepsilon$ represents the dielectric constant of the semiconductor, n represents the number of carriers per unit area in the channel, $C_{ox}$ represents the capacitance per unit area, $V_g$ represents the gate voltage, and t represents the thickness of the channel. In the case where the thickness of a semiconductor layer is 30 nm or less, the thickness of the channel can be regarded as being the same as the thickness of the semiconductor layer. The drain current $I_d$ in a linear region is expressed by Formula 4.

$$I_d = \frac{W \mu V_g V_d C_{ox}}{L} \exp\left(-\frac{E}{kT}\right) \quad \text{[Formula 4]}$$

Here, L represents the channel length and W represents the channel width, and, and Ware each 10 μm in this case. In addition, $V_d$ represents the drain voltage.

When dividing both sides of the Formula 4 by $V_g$ and then taking logarithms of both sides, Formula 5 is obtained.

$$\ln\left(\frac{I_d}{V_g}\right) = \ln\left(\frac{W\mu V_d C_{ox}}{L}\right) - \frac{E}{kT} \quad \text{[Formula 5]}$$
$$= \ln\left(\frac{W\mu V_d C_{ox}}{L}\right) - \frac{e^3 N^2 t}{8kT\varepsilon\, C_{ox} V_g}$$

The right side of Formula 5 is a function of $V_g$. From Formula 5, it is found that the defect density N can be obtained from a line in a graph that is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/V·s from Formula 2 and Formula 3. The measured mobility of an In—Sn—Zn oxide having a defect is approximately 40 cm³/V·s. However, assuming that no defect exists inside the semiconductor and at the interface between the semiconductor and an insulating film, the mobility $\mu_0$ of the oxide semiconductor is expected to be 120 cm²/V·s.

Note that even when no defect exists inside a semiconductor, scattering at an interface between a channel and a gate insulator affects the transport property of the transistor. In other words, the mobility $\mu_1$ at a position that is distance x away from the interface between the channel and the gate insulator is expressed by Formula 6.

$$\frac{1}{\mu_1} = \frac{1}{\mu_0} + \frac{D}{B}\exp\left(-\frac{x}{l}\right) \quad \text{[Formula 6]}$$

Here, D represents the electric field in the gate direction, and B and l are constants. The values of B and l can be obtained from actual measurement results, according to the above measurement results, B is 4.75×10⁷ cm/s and l is 10 nm (the depth to which the influence of interface scattering reaches). When D is increased (i.e., when the gate voltage is increased), the second term of Formula 6 is increased and accordingly the mobility t, is decreased.

Figure 16:
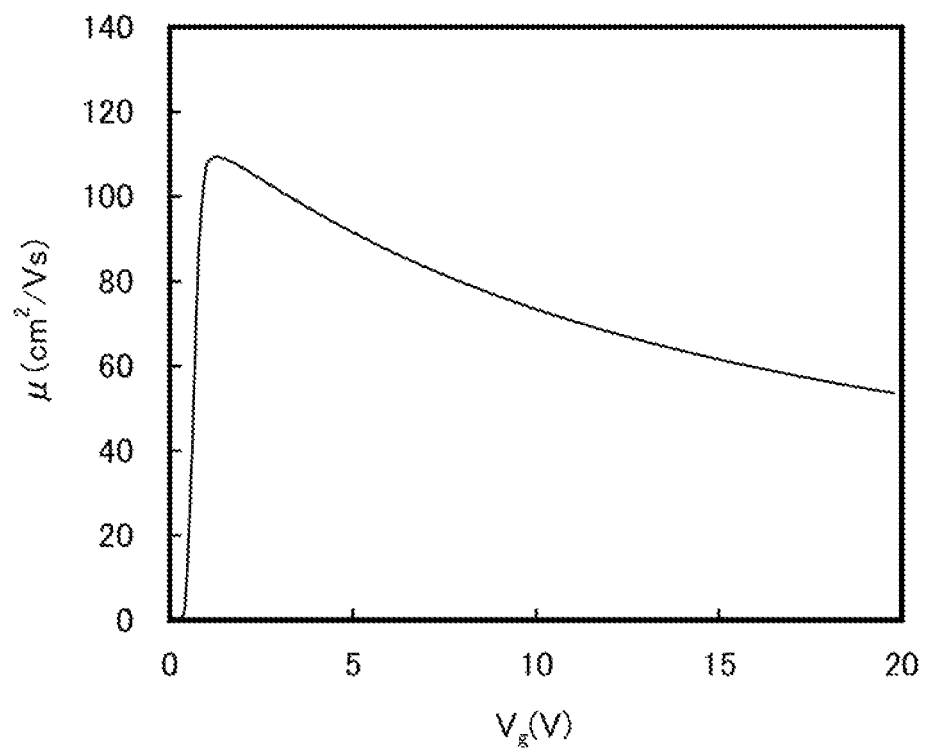
FIG. 16 is a graph showing gate voltage dependence of mobility obtained by calculation.

FIG. 16 shows calculation results of the mobility $\mu_2$ of a transistor whose channel formation region is formed using an ideal oxide semiconductor without a defect inside the semiconductor. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by sputtering.

Further, the work functions of a gate, a source, and a drain were assumed to be 5.5 eV, 4.6 eV, and 4.6 eV, respectively. The thickness of a gate insulator was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 16, the mobility has a peak of more than 100 cm²V·s at a gate voltage that is a little over 1 V, and is decreased as the gate voltage becomes higher because the influence of interface scattering is increased. Note that in order to reduce interface scattering, it is preferable that a surface of the semiconductor layer be flat at the atomic level (atomic layer flatness).

FIGS. 17A to 17C, FIGS. 18A to 18C, and FIGS. 19A to 19C show calculation results of characteristics of minute transistors formed using an oxide semiconductor having such a mobility. FIGS. 20A and 20B illustrate cross-sectional structures of the transistors used for the calculation. The transistors illustrated in FIGS. 20A and 20B each include a second region 1103b and a second region 1103c that have n⁺-type conductivity in an oxide semiconductor layer. The resistivity of the second regions 1103b and 1103c is $2 \times 10^{-3}$ Ω·cm.

The transistor in FIG. 20A is formed over a base insulating film 1101 and an embedded insulator 1102 that is formed using aluminum oxide and embedded in the base insulating film 1101. The transistor includes the second regions 1103b and 1103c, an intrinsic first region 1103a that is positioned between the second regions 1103b and 1103c and serves as a channel formation region, and a gate electrode 1105. The width of the gate electrode 1105 is 33 nm.

A gate insulating film 1104 is formed between the gate electrode 1105 and the first region 1103a. A sidewall insulating film 1106a and a sidewall insulating film 1106b are formed on both side surfaces of the gate electrode 1105. An insulator 1107 is formed over the gate electrode 1105 to prevent a short circuit between the gate electrode 1105 and another wiring. The sidewall insulating film has a width of 5 nm. A source electrode 1108a and a drain electrode 1108b are provided in contact with the second region 1103b and the second region 1103c, respectively. Note that the channel width of the transistor is 40 nm.

The transistor in FIG. 20B is the same as the transistor in FIG. 20A in that it is formed over the base insulating film 1101 and the embedded insulator 1102 formed using aluminum oxide and that it includes the second region 1103b, the second region 1103c, the intrinsic first region 1103a provided therebetween, the gate electrode 1105 having a width of 33 am, the gate insulating film 1104, the sidewall insulating film 1106a, the sidewall insulating film 1106b, the insulator 1107, the source electrode 1108a, and the drain electrode 1108b.

The transistor in FIG. 20A is different from the transistor in FIG. 20B in the conductivity type of semiconductor regions under the sidewall insulating films 1106a and 1106b. In the transistor in FIG. 20A, the semiconductor regions under the sidewall insulating films 1106a and 1106b are parts of the second regions 1103b and 1103c having n⁺-type conductivity, whereas in the transistor in FIG. 20B, the semiconductor regions under the sidewall insulating films 1106a and 1106b are parts of the intrinsic first region 1103a. In other words, a region having a width of $L_{off}$ which overlaps with neither the second region 1103b (the second region 1103c) nor the gate electrode 1105 is provided. This region is called an offset region, and the width $L_{off}$ is called an offset length. As is seen from the drawing, the offset length is equal to the width of the sidewall insulating film 1106a (the sidewall insulating film 1106b).

Figure 17A:
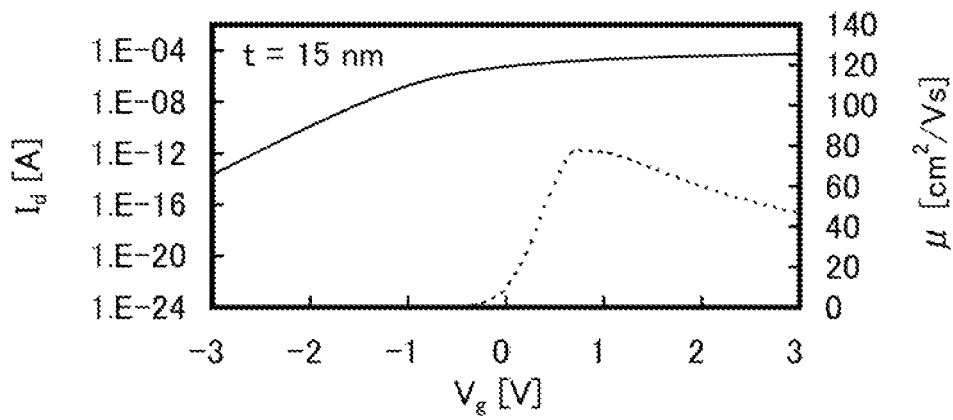
FIGS. 17A to 17C are graphs showing gate voltage dependence of drain current and mobility obtained by calculation.
Figure 17B:
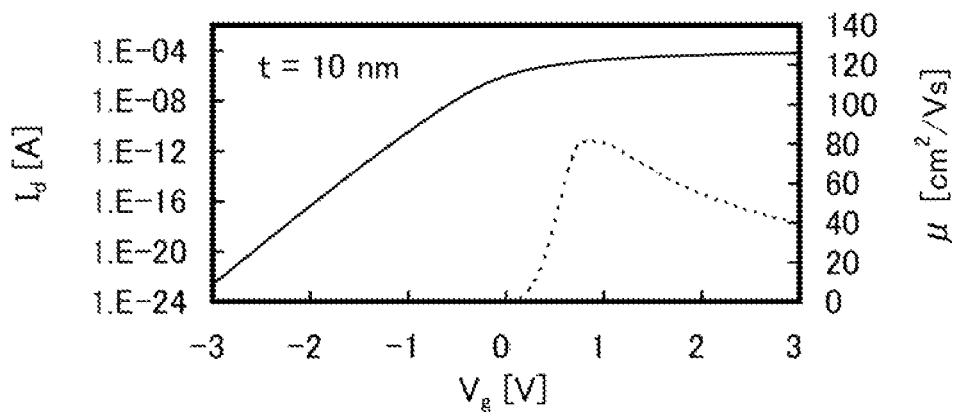
Figure 17C:
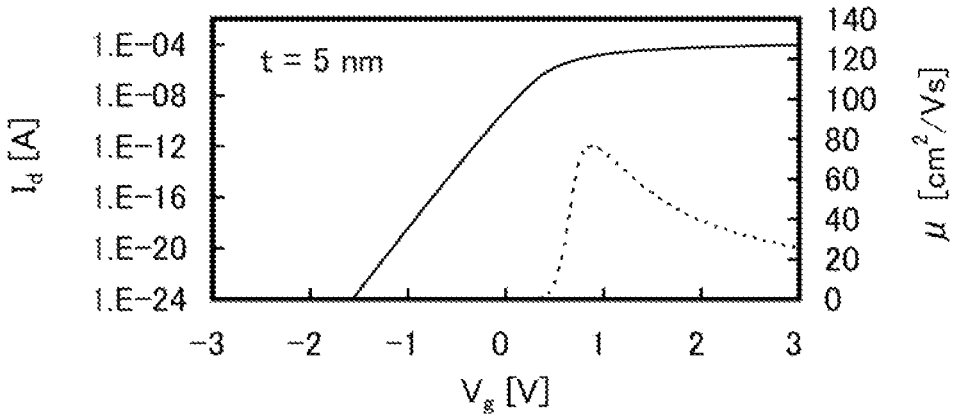

The other parameters used in the calculation are as described above. For the calculation, device simulation software Sentaurus Device manufactured by Synopsys, Inc. was used. FIGS. 17A to 17C show the gate voltage ($V_g$: a potential difference between the gate and the source) dependence of the drain current ($I_d$, a solid line) and the mobility (p, a dotted line) of the transistor having the structure illustrated in FIG. 20A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 17A shows the gate voltage dependence of the transistor in the case where the thickness of the gate insulating film is 15 nm, FIG. 17B shows that of the transistor in the case where the thickness of the gate insulating film is 10 nm, and FIG. 17C shows that of the transistor in the case where the thickness of the gate insulating film is 5 am. As the gate insulating film is thinner, the drain current $I_d$ in the off state (off-state current) in particular is significantly decreased. In contrast, there is no noticeable change in the peak value of the mobility μ and the drain current $I_d$ in the on state (on-state current). The graphs show that the drain current exceeds 10 μA, which is required in a memory element and the like, at a gate voltage of around 1 V.

Figure 18A:
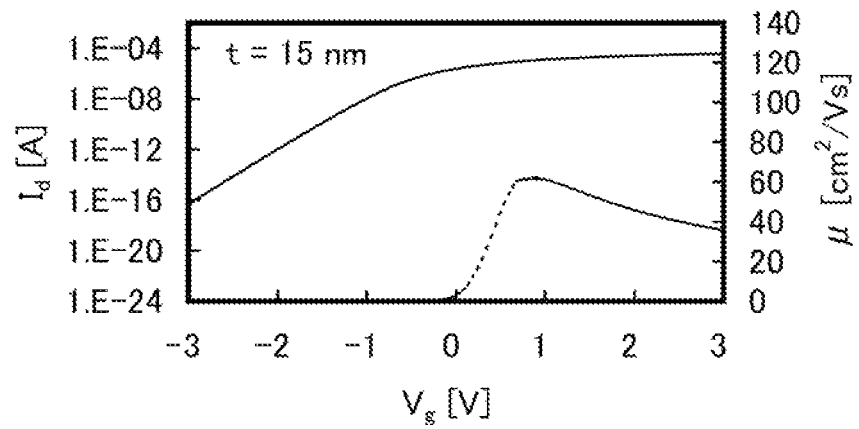
FIGS. 18A to 18C are graphs showing gate voltage dependence of drain current and mobility obtained by calculation.
Figure 18B:
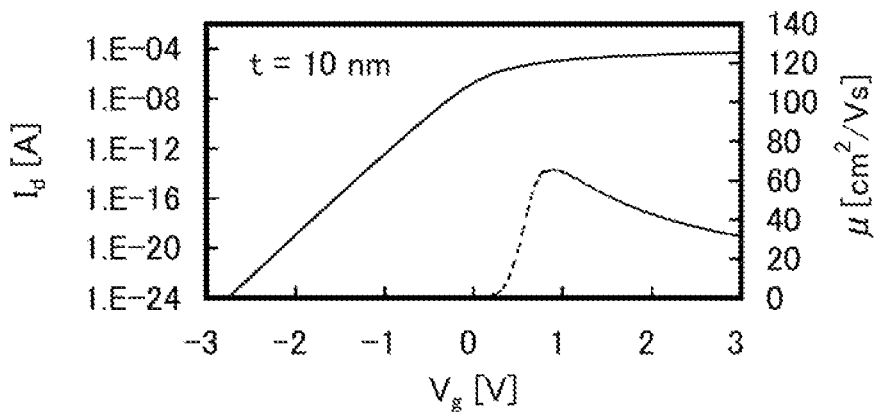
Figure 18C:
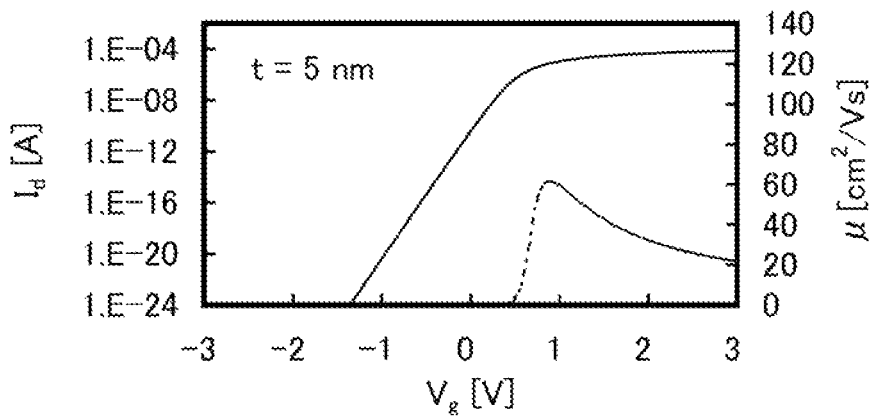

FIGS. 18A to 18C show the gate voltage $V_g$ dependence of the drain current $I_d$ (a solid line) and the mobility μ(a dotted line) of the transistor having the structure in FIG. 20B and an offset length $L_{off}$ of 5 nm. The drain current $I_d$ is obtained by calculation under the assumption that the drain voltage is +1 V and the mobility μ is obtained by calculation under the assumption that the drain voltage is +0.1 V. FIG. 18A shows the gate voltage dependence of the transistor in the case where the thickness of the gate insulating film is 15 nm, FIG. 18B shows that of the transistor in the case where the thickness of the gate insulating film is 10 nm, and FIG. 18C shows that of the transistor in the case where the thickness of the gate insulating film is 5 nm.

Figure 19A:
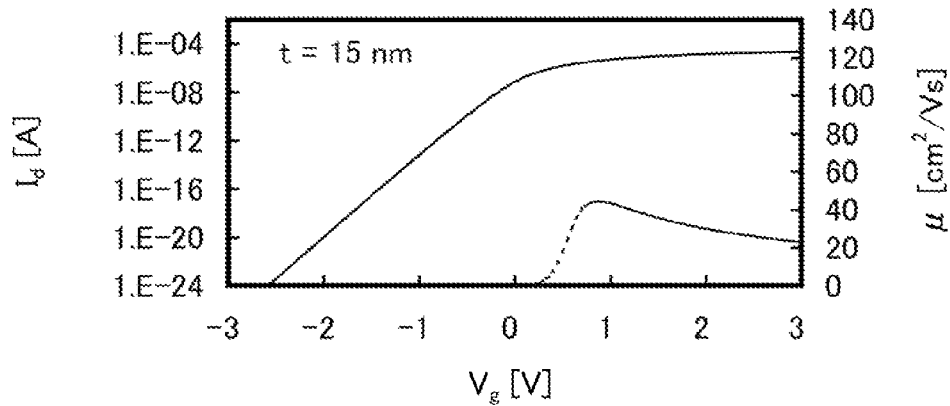
FIGS. 19A to 19C are graphs showing gate voltage dependence of drain current and mobility obtained by calculation.
Figure 19B:
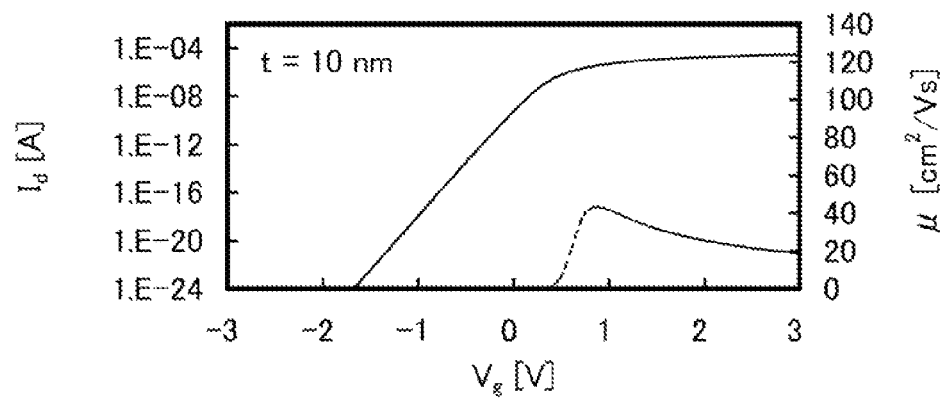
Figure 19C:
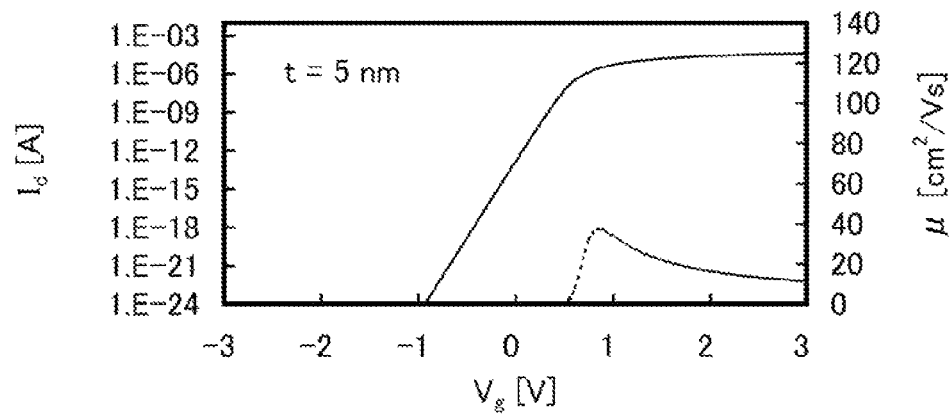

FIGS. 19A to 19C show the gate voltage dependence of the drain current $I_d$ (a solid line) and the mobility μ (a dotted line) of the transistor having the structure in FIG. 20B and an offset length $L_{off}$ of 15 nm. The drain current $I_d$ is obtained by calculation under the assumption that the drain voltage is 4-1 V and the mobility μ is obtained by calculation under the assumption that the drain voltage is +0.1 V. FIG. 19A shows the gate voltage dependence of the transistor in the case where the thickness of the gate insulating film is 15 nm, FIG. 19B shows that of the transistor in the case where the thickness of the gate insulating film is 10 nm, and FIG. 19C shows that of the transistor in the case where the thickness of the gate insulating film is 5 am.

In either of the structures, as the gate insulating film is thinner, the off-state current is significantly decreased, whereas no noticeable change arises in the peak value of the mobility μ and the on-state current.

Note that the peak of the mobility μ is approximately 80 cm$^2$/V·s in FIGS. 17A to 17C, approximately 60 cm$^2$/V·s in FIGS. 18A to 18C, and approximately 40 cm$^3$V·s in FIGS. 19A to 19C: thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 μA, which is required in a memory element and the like, at a gate voltage of around 1 V. When the transistor with such high mobility is used in a memory unit of the unit cell included in the programmable circuit shown in the foregoing embodiments, data for switching the state of the unit cell can be written at high speed.

The structures, methods, and the like described in this embodiment can be combined as appropriate with any of the structures, methods, and the like described in the other embodiments.

Embodiment 5

In this embodiment, a transistor including the oxide semiconductor film containing In, Sn, and Zn as its main components will be specifically described as an example of the transistor including the oxide semiconductor film shown in Embodiments 3 and 4.

A transistor in which an oxide semiconductor containing In, Sn, and Zn as its main components is used for a channel formation region can have favorable characteristics by depositing the oxide semiconductor while heating a substrate or by performing heat treatment after the oxide semiconductor film is formed. Note that a main component refers to an element included in a composition at 5 atomic % or more.

By intentionally heating the substrate after formation of the oxide semiconductor film containing In, Sn, and Zn as its main components, the field-effect mobility of the transistor can be increased. Further, the threshold voltage of the transistor can be positively shifted to make the transistor normally off. A description is given below of fabrication of a transistor including an oxide semiconductor film containing In, Sn, and Zn as its main components and the results of various measurements of the transistor.

Figure 26A:
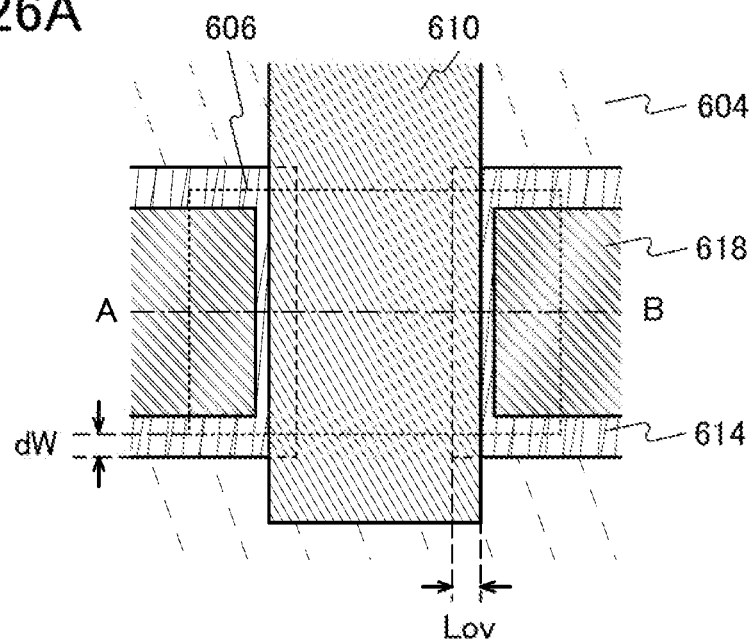
FIGS. 26A and 26B are a plan view and a cross-sectional view of a transistor used for measurement.

First, the structure of the transistor used for various measurements in this embodiment will be described with reference to FIGS. 26A and 26B. FIG. 26A is a plan view of the transistor, and FIG. 26B is a cross-sectional view along dashed line A-B in FIG. 26A.

Figure 26B:
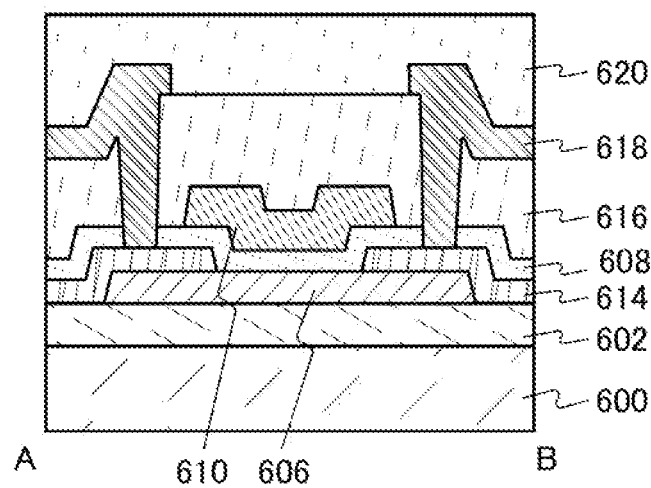

The transistor illustrated in FIG. 26B includes a substrate 600, a base insulating film 602 provided over the substrate 600, an oxide semiconductor film 606 provided over the base insulating film 602, a pair of electrodes 614 in contact with the oxide semiconductor film 606, a gate insulating film 608 provided over the oxide semiconductor film 606 and the pair of electrodes 614, a gate electrode 610 provided to overlap with the oxide semiconductor film 606 with the gate insulating film 608 positioned therebetween, an interlayer insulating film 616 provided to cover the gate insulating film 608 and the gate electrode 610, wirings 618 electrically connected to the pair of electrodes 614 through openings formed in the interlayer insulating film 616, and a protective film 620 provided to cover the interlayer insulating film 616 and the wirings 618. The pair of electrodes 614 functions as source and drain electrodes of the transistor.

Here, the substrate 600 was a glass substrate. The base insulating film 602 was a silicon oxide film. The oxide semiconductor film 606 was an n-Sn—Zn—O film. As the pair of electrodes 614, a tungsten film was used. The gate insulating film 608 was a silicon oxide film. The gate electrode 610 had a layered structure of a tantalum nitride film and a tungsten film. The interlayer insulating film 616 had a layered structure of a silicon oxynitride film and a polyimide film. The wirings 618 had a layered structure in which a titanium film, an aluminum film, and a titanium film were formed in this order. The protective film 620 was a polyimide film.

Note that in the transistor having the structure illustrated in FIG. 26A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

Figure 21A:
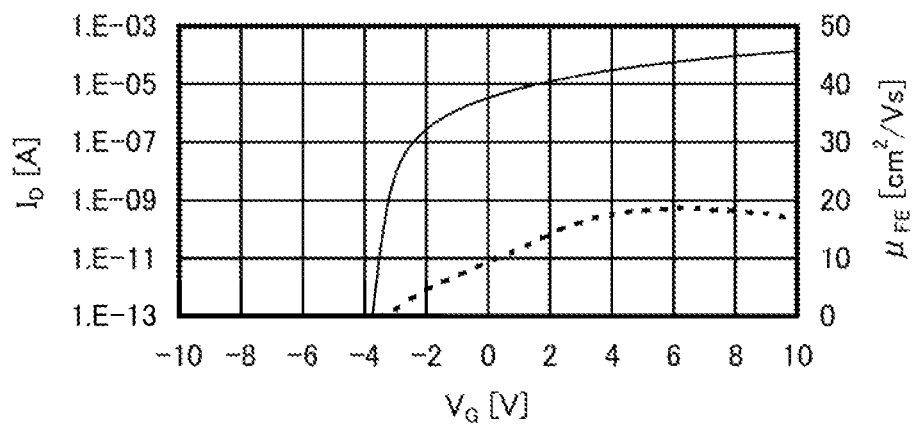
FIGS. 21A to 21C are graphs each showing characteristics of a transistor including an oxide semiconductor film.
Figure 21B:
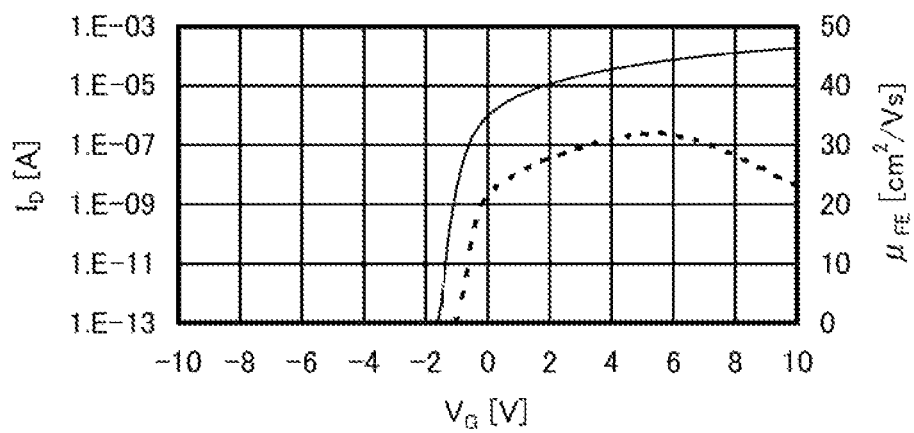
Figure 21C:
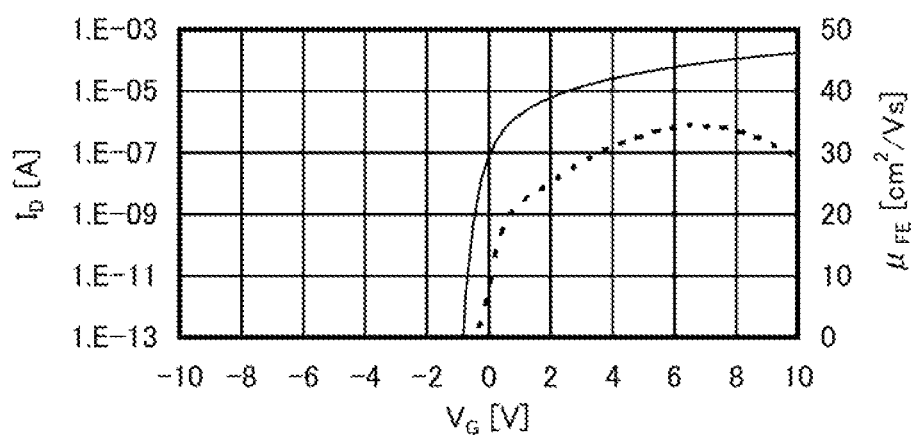

FIGS. 21A to 21C each show characteristics of a transistor that has the structure illustrated in FIGS. 26A and 26B and includes an oxide semiconductor film with a channel length L of 3 μm and a channel width W of 10 μm, and a 100-nm-thick gate insulating film. Note that $V_d$ was set to 10 V.

FIG. 21A shows characteristics of a transistor whose oxide semiconductor film containing In, Sn, and Zn as its main components was formed by sputtering without heating a substrate intentionally. The field-effect mobility of the transistor is 18.8 cm$^2$/V·s. On the other hand, when the oxide semiconductor film containing In, Sn, and Zn as its main components is formed while the substrate is heated intentionally, the field-effect mobility can be increased. FIG. 21B shows characteristics of a transistor whose oxide semiconductor film containing In, Sn, and Zn as its main components was formed while heating a substrate at 200° C. The field-effect mobility of the transistor is 32.2 cm$^2$/V·s.

The field-effect mobility can be further increased by performing heat treatment after formation of the oxide semiconductor film containing In, Sn, and Zn as its main components. FIG. 21C shows characteristics of a transistor whose oxide semiconductor film containing In, Sn, and Zn as its main components was formed by sputtering at 200° C. and then subjected to heat treatment at 650° C. The field-effect mobility of the transistor is 34.5 cm$^2$/V·s.

The intentional heating of the substrate is expected to have an effect of reducing moisture taken into the oxide semiconductor film during the deposition by sputtering. Further, the heat treatment after the deposition enables hydrogen, a hydroxyl group, or moisture to be released and removed from the oxide semiconductor film. In this manner, the field-effect mobility can be increased. Such an increase in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm$^2$/V·s is expected to be realized.

The oxide semiconductor containing In, Sn, and Zn as its main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during the deposition and/or the heat treatment after the deposition contributes not only to increasing field-effect mobility but also to making the transistor normally off. In a transistor in which an oxide semiconductor film that contains In, Sn, and Zn as its main components and is formed without heating a substrate intentionally is used as a channel formation region, the threshold voltage tends to be shifted negatively. In contrast, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 21A and 21B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by using a target with a composition ratio of In:Sn:Zn=2:1:3.

The temperature of the intentional heating of the substrate or the temperature of the heat treatment is 150° C. or higher, preferably 200° C. or higher, further preferably 400° C. or higher. When the deposition or heat treatment is performed at a high temperature, the transistor can be normally off.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further enhanced. In order to supply oxygen after dehydration or dehydrogenation, a method in which oxygen ions are accelerated by electric fields and implanted into the oxide semiconductor film may be employed.

A defect due to oxygen vacancy is easily caused in the oxide semiconductor or at an interface between the oxide semiconductor and a stacked film: however, when excess oxygen is included in the oxide semiconductor by the heat treatment, oxygen vacancy caused constantly can be compensated for with excess oxygen. The excess oxygen is oxygen existing mainly between lattices. When the concentration of oxygen is set in the range of $1\times10^{16}$/cm$^3$ to $2\times10^{2}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film that is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed with X-ray diffraction.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and then heat treatment in an oxygen atmosphere was performed for one hour without lowering the temperature. A sample manufactured in this manner was used as Sample B.

Figure 22:
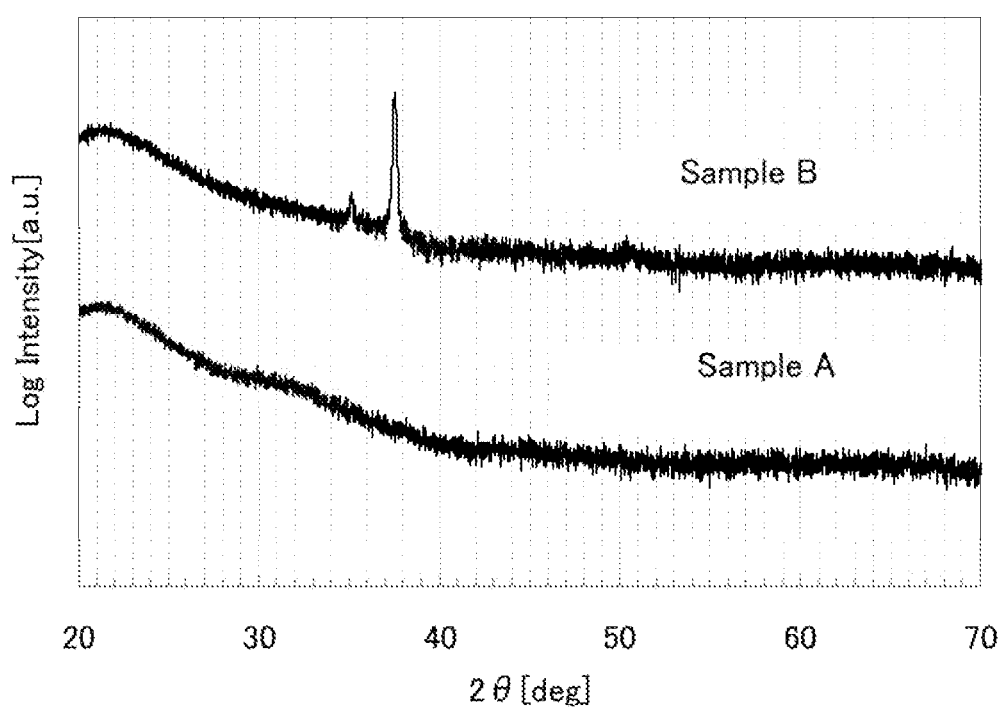
FIG. 22 shows XRD spectra of Sample A and Sample B.

FIG. 22 shows XRD spectra of Sample A and Sample B. No peak derived from a crystal was observed in Sample A, whereas peaks derived from a crystal were observed when 2θ was around 35 deg and 37 deg to 38 deg in Sample B.

As described above, by intentionally heating a substrate during deposition of an oxide semiconductor containing In, Sn, and Zn as its main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of the oxide semiconductor enables the off-state current of the transistor to be 1 aA/μm or lower. Here, the unit of the off-state current represents current per micrometer of a channel width.

Figure 23:
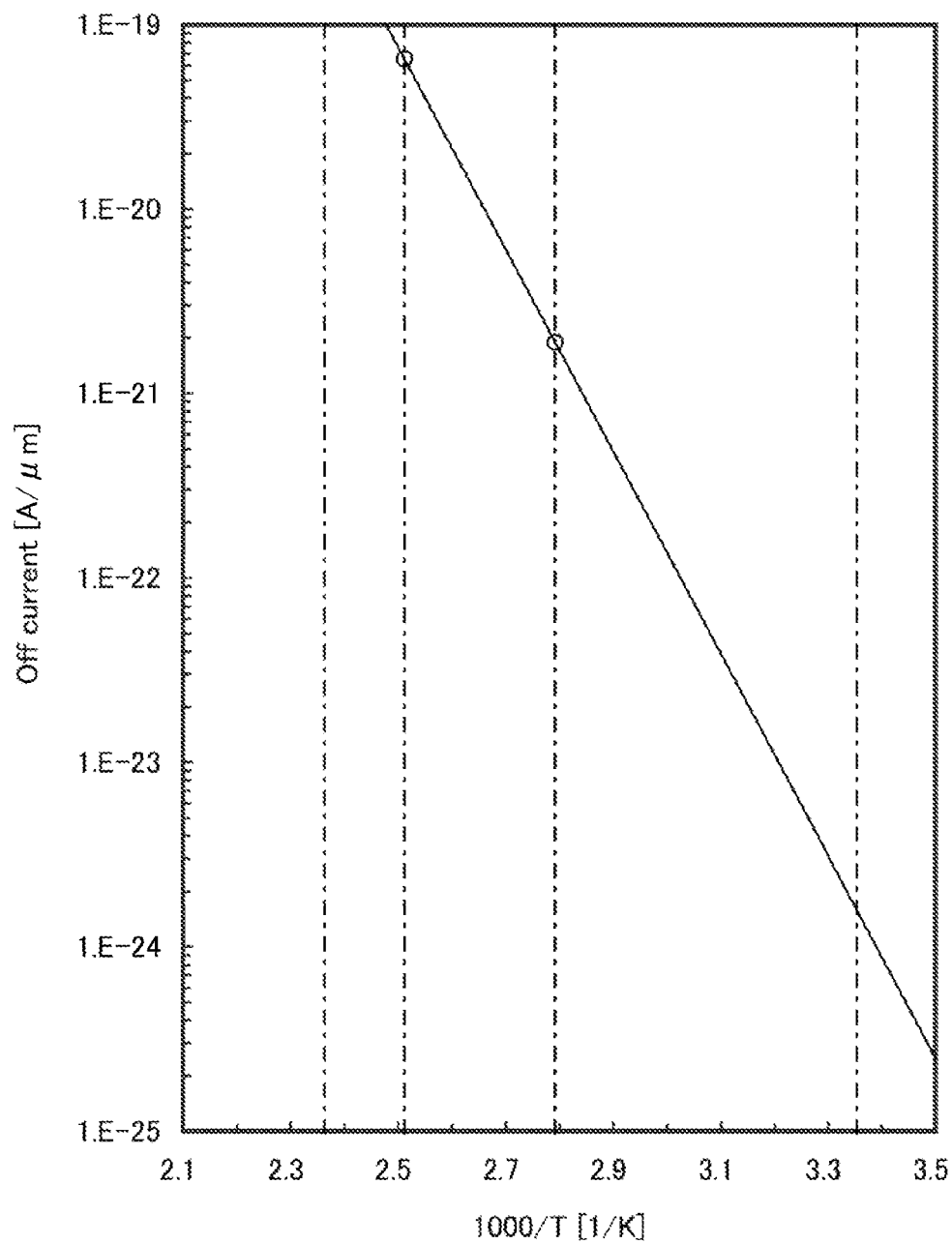
FIG. 23 is a graph showing a relation between off-state current of a transistor and substrate temperature in measurement.

FIG. 23 shows a relation between the off-state current of a transistor and the inverse of substrate temperature (absolute temperature) at measurement. Here, for simplicity, the horizontal axis represents a value (1000/T) obtained by multiplying an inverse of the substrate temperature at measurement by 1000.

Specifically, as shown in FIG. 23, the off-state current was 0.1 aA/μm ($1\times10^{-19}$ A/μm) or lower, and 10 zA/μm ($1\times10^{-20}$ A/μn) or lower when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-21}$ A/μm) or lower. Hence, the off-state current can be 1 zA/μm ($1\times10^{-21}$ A/μm) or lower, 100 zA/μm ($1\times10^{-19}$ A/μm) or lower, and 1 zA/μm ($1\times10^{-21}$ A/μm) or lower at 125° C., 85° C., and room temperature, respectively.

Note that in order to prevent hydrogen and moisture from being included in the oxide semiconductor film during the deposition, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor containing In, Sn, and Zn as its main components by heat treatment, a film that does not include moisture originally is preferably formed because moisture is released from the oxide semiconductor containing In, Sn, and Zn as its main components at a higher temperature than from an oxide semiconductor containing In, Ga, and Zn as its main components.

The relation between the substrate temperature and electric characteristics of a transistor of Sample B, on which heat treatment at 650° C. was performed after formation of the oxide semiconductor film, was evaluated.

The transistor used for the measurement has a channel length L of 3 μm, a channel width W of 10 μm, Lov of 3 μm on one side (total Lov of 6 μm), and dW of 0 μm. Note that $V_d$ was set to 10 V. The substrate temperature was −40° C., −25° C. 25° C., 75° C., 125° C., and 150° C. Here, in the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 24:
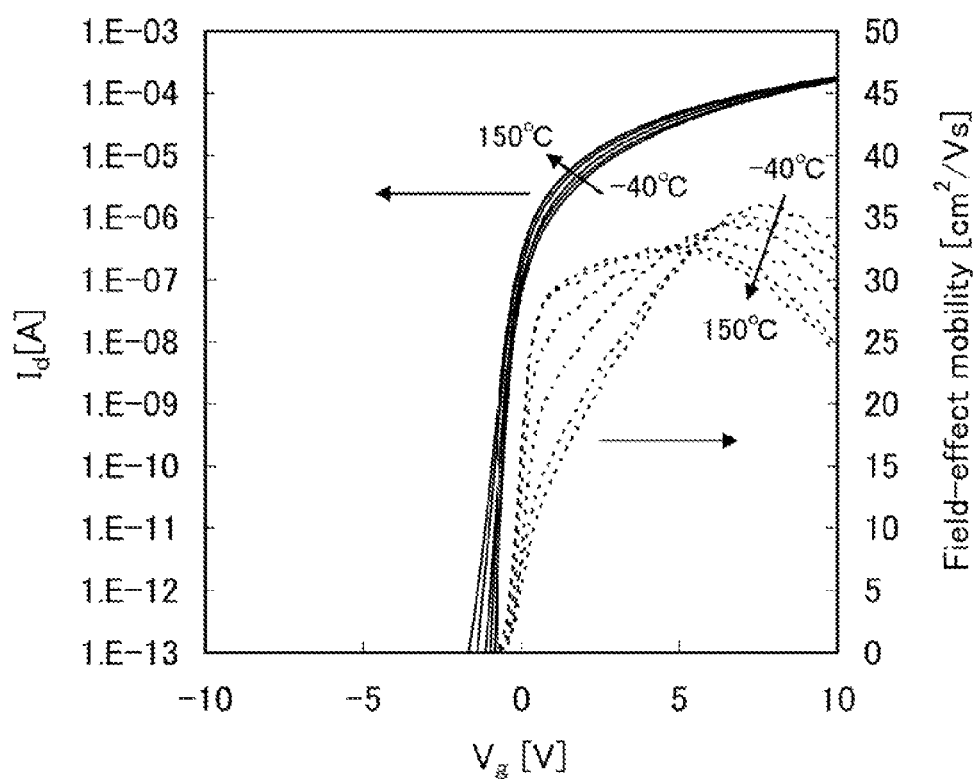
FIG. 24 shows $V_g$ dependence of $I_d$ and field-effect mobility.
Figure 25A:
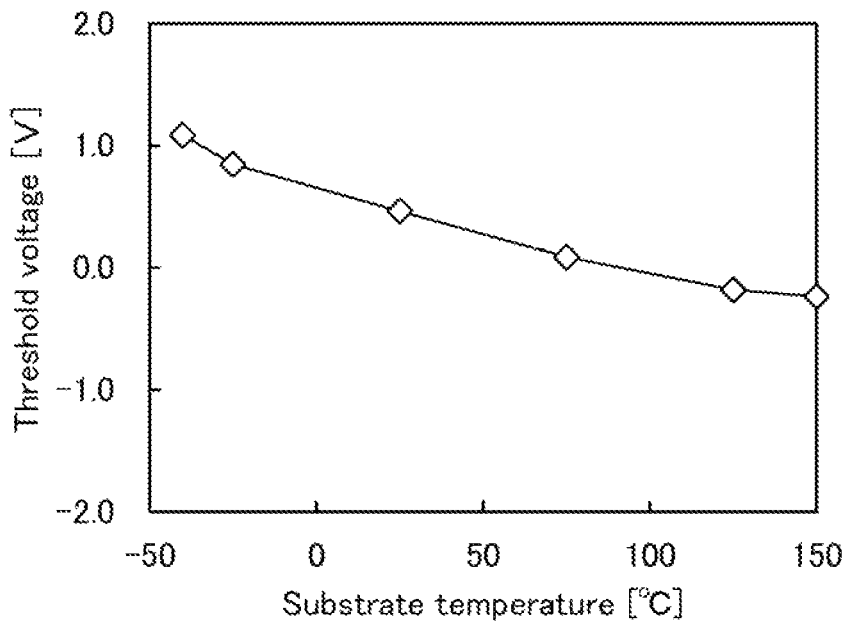
FIG. 25A shows a relation between threshold voltage and substrate temperature.

FIG. 24 shows the $V_g$ dependence of $I_d$ (a solid line) and field-effect mobility (a dotted line). FIG. 25A shows a relation between the substrate temperature and the threshold voltage, and FIG. 25B shows a relation between the substrate temperature and the field-effect mobility.

From FIG. 25A, it is found that the threshold voltage gets lower as the substrate temperature increases. Note that the threshold voltage is decreased from 1.09 V to −0.23 V in the range from −40° C. to 150° C.

Figure 25B:
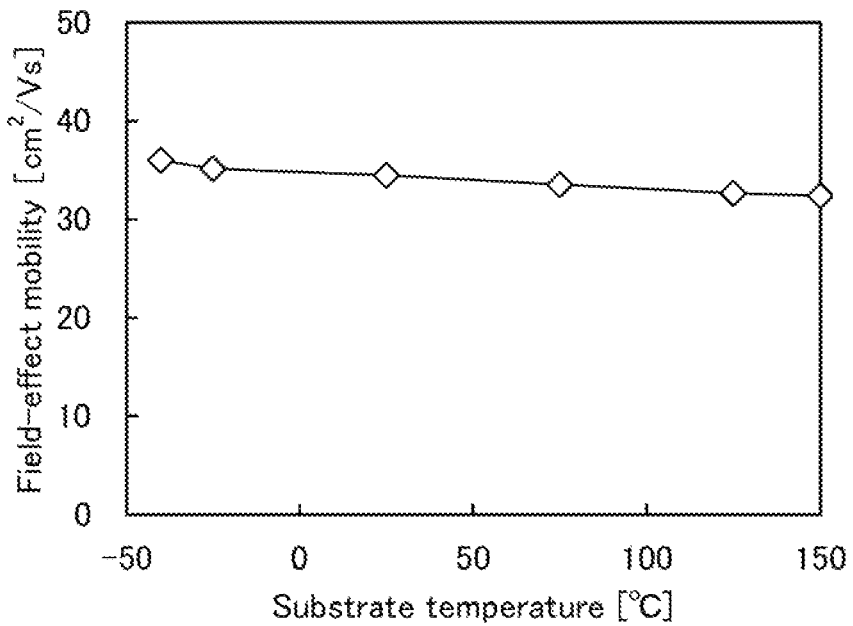
FIG. 25B shows a relation between field-effect mobility and substrate temperature.

From FIG. 25B, it is found that the field-effect mobility gets lower as the substrate temperature increases. Note that the field-effect mobility is decreased from 36 cm²/V·s to 32 cm²n/V·s in the range from −40° C. to 150° C. Thus, it is found that variation in electric characteristics is small in the above temperature range.

In the transistor including the oxide semiconductor layer containing In, Sn, and Zn as its main components, the field-effect mobility can be 30 cm²/V·s or higher, preferably 40 cm²/V·s or higher, further preferably 60 cm²/V·s or higher with the off-state current maintained at 1 aA/μm or lower, and can have on-state current high enough to meet the specifications demanded for LSIs. For example, in an FET with a channel width of 40 nm and a channel length of 33 nm, an on-state current of 12 μA or higher can flow when the gate voltage is 2.7 V and the drain voltage is 1.0 V.

When the transistor with such low off-state current is used in a memory unit of the programmable switch shown in the foregoing embodiments, configuration data can be held even when supply of the power supply potential is interrupted. Thus, write of configuration data after power on can be omitted, so that the start time of the logic block can be shortened. Accordingly, a programmable logic device in which power consumption can be reduced by employing a normally-off driving method can be provided.

In addition, when the transistor with such low off-state current is used in a memory unit of the programmable switch shown in the foregoing embodiments, configuration data can be written at high speed, so that a programmable logic device in which dynamic reconfiguration can be easily achieved can be provided.

Since the transistor including the oxide semiconductor has such characteristics, it is possible to provide a programmable logic device whose operation speed is not decreased even when the transistor including the oxide semiconductor is included in an integrated circuit formed using a silicon semiconductor.

Embodiment 6

With the use of a programmable circuit according to one embodiment of the present invention, a low-power electronic device can be provided. In particular, when a low-power semiconductor device according to one embodiment of the present invention is added as a component of a portable electronic device which has difficulty in continuously receiving power, the portable electronic device can have a long continuous operation time.

A semiconductor device including a programmable circuit according to one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic devices that can include a semiconductor device according to one embodiment of the present invention are mobile phones, game machines including portable game machines, personal digital assistants, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines.

A description is given of the case where the semiconductor device including the programmable circuit according to one embodiment of the present invention is applied to a portable electronic device such as a mobile phone, a smartphone, or an e-book reader.

Figure 10:
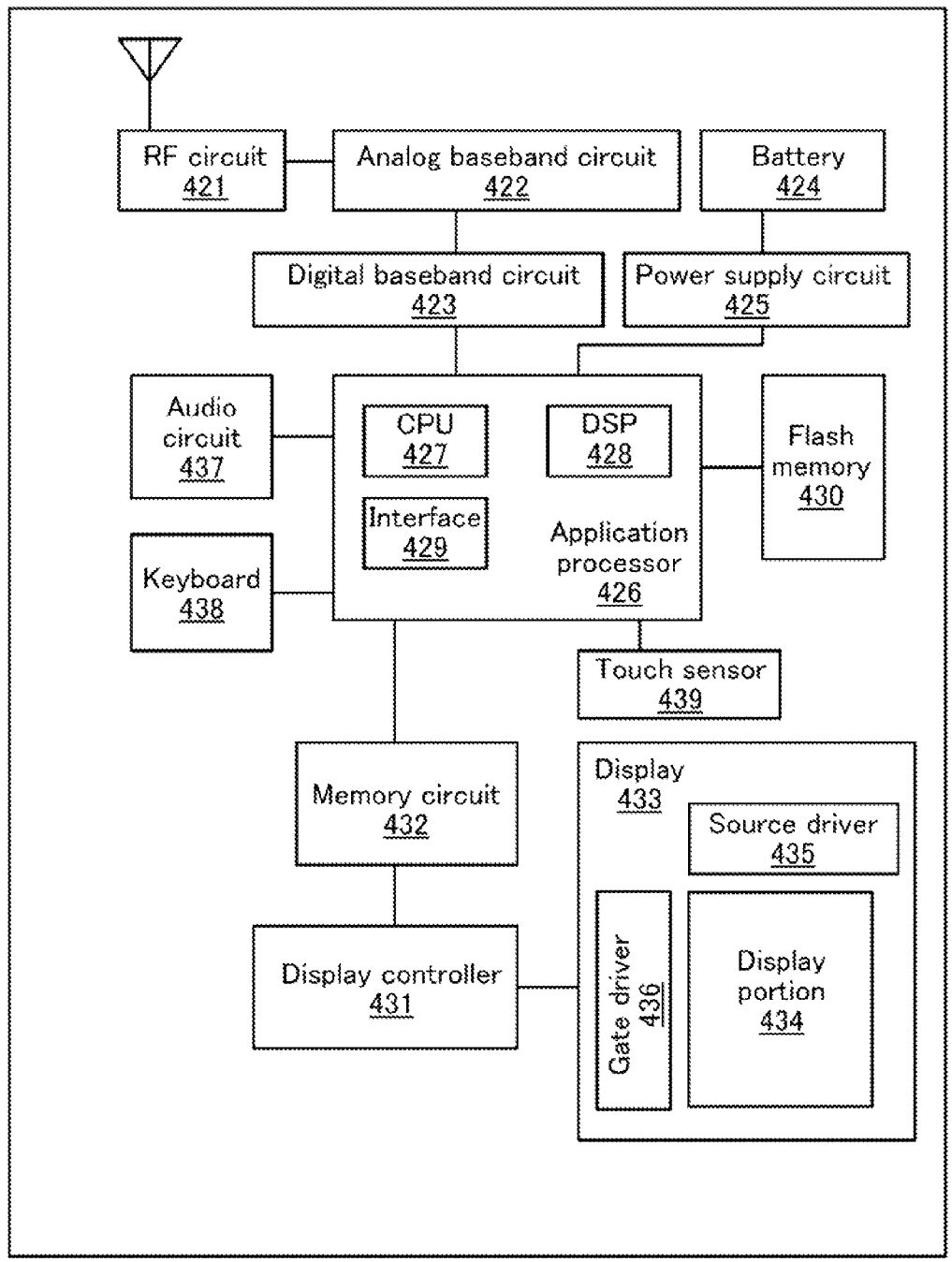
FIG. 10 is a block diagram of a portable electronic device.

FIG. 10 is a block diagram of a portable electronic device. The portable electronic device in FIG. 10 includes an RF circuit 421, an analog baseband circuit 422, a digital baseband circuit 423, a battery 424, a power supply circuit 425, an application processor 426, a flash memory 430, a display controller 431, a memory circuit 432, a display 433, a touch sensor 439, an audio circuit 437, a keyboard 438, and the like. The display 433 includes a display portion 434, a source driver 435, and a gate driver 436. The application processor 426 includes a CPU 427, a DSP 428, and an interface 429. For example, when the programmable circuit described in any of the above embodiments is used for any or all of the RF circuit 421, the analog baseband circuit 422, the memory circuit 432, the application processor 426, the display controller 431, and the audio circuit 437, power consumption can be reduced.

Figure 11:
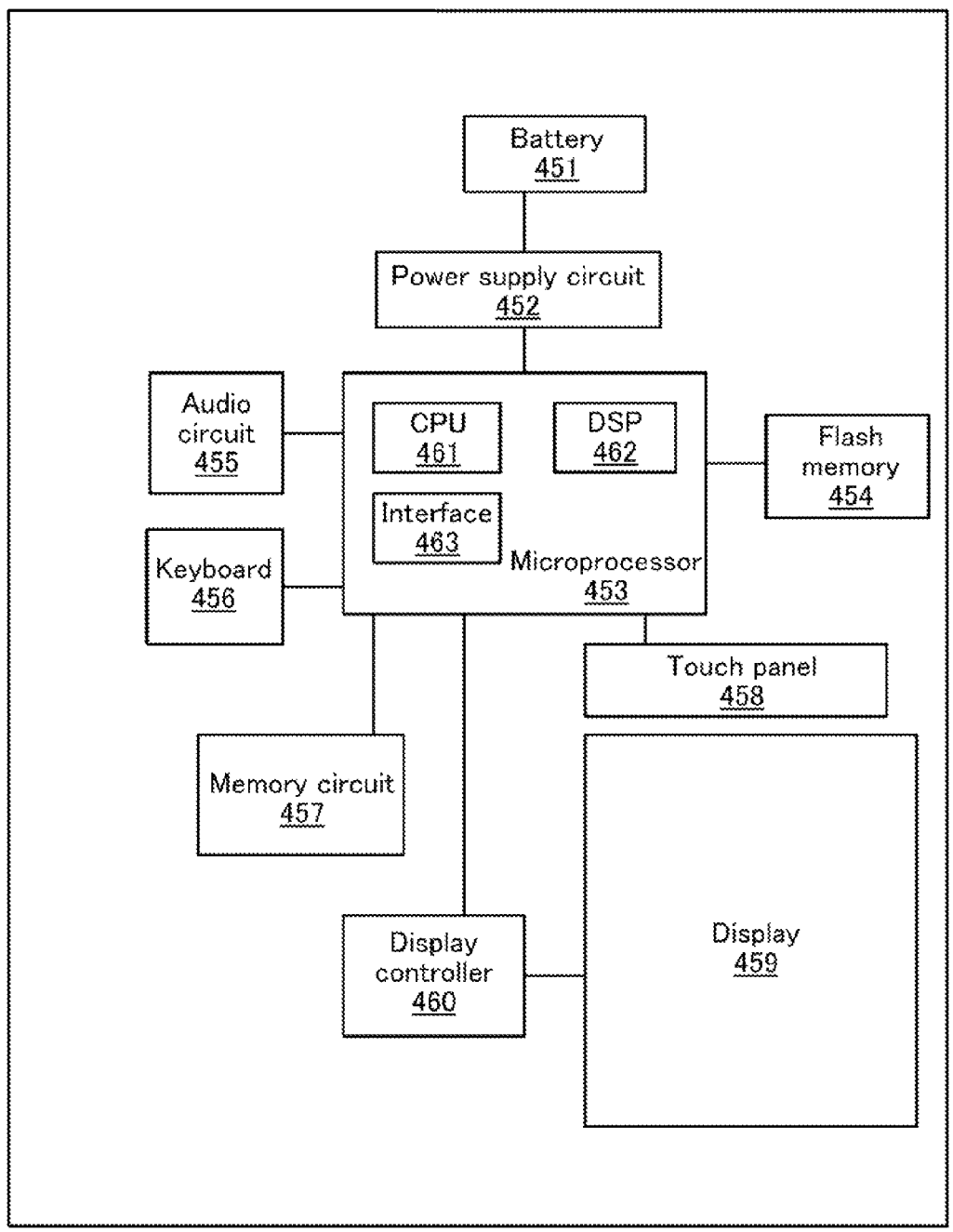
FIG. 11 is a block diagram of an e-book reader.

FIG. 11 is a block diagram of an e-book reader. The e-book reader includes a battery 451, a power supply circuit 452, a microprocessor 453, a flash memory 454, an audio circuit 455, a keyboard 456, a memory circuit 457, a touch panel 458, a display 459, and a display controller 460. The microprocessor 453 includes a CPU 461, a DSP 462, and an interface 463. For example, when the programmable circuit described in any of the above embodiments is used for any or all of the audio circuit 455, the memory circuit 457, the microprocessor 453, and the display controller 460, power consumption can be reduced.

The structures, methods, and the like described in this embodiment can be combined as appropriate with any of the structures, methods, and the like described in the other embodiments.

This application is based on Japanese Patent Applications serial No. 2011-121559 filed with Japan Patent Office on May 31, 2011, the entire contents of which are hereby incorporated by reference.

What is claimed is:

1. A semiconductor device comprising:
a programmable circuit comprising:
a first unit cell;
a second unit cell;
a bit line;
a first unit cell selection line;
a first analog element selection line;
a first input signal line;
a first output signal line,
a second unit cell selection line;
a second analog element selection line;
a second input signal line; and
a second output signal line,
wherein:
the first unit cell comprises a first transistor, a second transistor, a third transistor, a fourth transistor, and a first analog element,
the first unit cell selection line and a gate electrode of the first transistor are electrically connected to each other,
the bit line, one of a source electrode and a drain electrode of the first transistor, and one of a source electrode and a drain electrode of the third transistor are electrically connected to each other,
the first analog element selection line and a gate electrode of the third transistor are electrically connected to each other,
the first input signal line, one of a source electrode and a drain electrode of the second transistor, and one of electrodes of the first analog element are electrically connected to each other,
the other of the electrodes of the first analog element and one of a source electrode and a drain electrode of the fourth transistor are electrically connected to each other,
the first output signal line, the other of the source electrode and the drain electrode of the second transistor, and the other of the source electrode and the drain electrode of the fourth transistor are electrically connected to each other,
the first output signal line and the second input signal line are electrically connected to each other,
the second unit cell comprises a fifth transistor, a sixth transistor, and a second analog element,
the second unit cell selection line and a gate electrode of the fifth transistor are electrically connected to each other,
the bit line, one of a source electrode and a drain electrode of the fifth transistor, and one of a source electrode and a drain electrode of the sixth transistor are electrically connected to each other,
the second analog element selection line and a gate electrode of the sixth transistor are electrically connected to each other,
the second input signal line and one of electrodes of the second analog element are electrically connected to each other, and
the other of the electrodes of the second analog element and the second output signal line are electrically connected to each other.

2. The semiconductor device according to claim 1, wherein at least one of the first transistor and the third transistor comprises an oxide semiconductor.

3. The semiconductor device according to claim 1, wherein at least one of the fifth transistor and the sixth transistor comprises an oxide semiconductor.

4. The semiconductor device according to claim 1, wherein the first analog element is a resistor.

5. The semiconductor device according to claim 1, wherein the resistor comprises an oxide semiconductor.

6. The semiconductor device according to claim 1, wherein the first analog element is a capacitor, a coil, or a photoelectric conversion element.

7. The semiconductor device according to claim 1, wherein the second analog element is a resistor.

8. The semiconductor device according to claim 7, wherein the resistor comprises an oxide semiconductor.

9. The semiconductor device according to claim 1, wherein the second analog element is a capacitor, a coil, or a photoelectric conversion element.

10. The semiconductor device according to claim 1,
wherein the other of the source electrode and the drain electrode of the first transistor and a gate electrode of the second transistor are electrically connected to each other to form a first node, and
wherein the other of the source electrode and the drain electrode of the third transistor and a gate electrode of the fourth transistor are electrically connected to each other to form a second node.

11. A semiconductor device comprising:
a plurality of unit circuits arranged in a matrix with h rows and n columns, each of unit circuits comprises;
a first unit cell;
a second unit cell;
a first input signal line;
a first output signal line,
a second input signal line; and
a second output signal line,
wherein:

the first unit cell comprises a first transistor, a second transistor, a third transistor, a fourth transistor, and a first analog element, one of a source electrode and a drain electrode of the first transistor, and one of a source electrode and a drain electrode of the third transistor are electrically connected to each other, the first input signal line, one of a source electrode and a drain electrode of the second transistor, and one of electrodes of the first analog element are electrically connected to each other, the other of the electrodes of the first analog element and one of a source electrode and a drain electrode of the fourth transistor are electrically connected to each other, the first output signal line, the other of the source electrode and the drain electrode of the second transistor, and the other of the source electrode and the drain electrode of the fourth transistor are electrically connected to each other, the first output signal line and the second input signal line are electrically connected to each other, the second unit cell comprises a fifth transistor, a sixth transistor, a seventh transistor, an eighth transistor, and a second analog element, one of a source electrode and a drain electrode of the fifth transistor, and one of a source electrode and a drain electrode of the seventh transistor are electrically connected to each other, one of a source electrode and a drain electrode of the sixth transistor, and one of electrodes of the second analog element are electrically connected to each other, the other of the electrodes of the second analog element and one of a source electrode and a drain electrode of the eighth transistor are electrically connected to each other, and the other of the source electrode and the drain electrode of the sixth transistor, and the other of the source electrode and the drain electrode of the eighth transistor are electrically connected to each other.

12. The semiconductor device according to claim 11, wherein at least one of the first transistor and the third transistor comprises an oxide semiconductor.

13. The semiconductor device according to claim 11, wherein at least one of the fifth transistor and the seventh transistor comprises an oxide semiconductor.

14. The semiconductor device according to claim 11, wherein the first analog element is a resistor.

15. The semiconductor device according to claim 14, wherein the resistor comprises an oxide semiconductor.

16. The semiconductor device according to claim 11, wherein the first analog element is a capacitor, a coil, or a photoelectric conversion element.

17. The semiconductor device according to claim 11, wherein the second analog element is a resistor.

18. The semiconductor device according to claim 17, wherein the resistor comprises an oxide semiconductor.

19. The semiconductor device according to claim 11, wherein the second analog element is a capacitor, a coil, or a photoelectric conversion element.

20. The semiconductor device according to claim 11,
wherein the other of the source electrode and the drain electrode of the first transistor and a gate electrode of the second transistor are electrically connected to each other to form a first node, and
wherein the other of the source electrode and the drain electrode of the third transistor and a gate electrode of the fourth transistor are electrically connected to each other to form a second node.

21. The semiconductor device according to claim 11, further comprises:
a bit line;
a first unit cell selection line; and
a first analog element selection line,
wherein:
the bit line, the one of the source electrode and the drain electrode of the first transistor, and the one of the source electrode and the drain electrode of the fifth transistor are electrically connected to each other,
the first unit cell selection line and a gate electrode of the first transistor are electrically connected to each other, and
the first analog element selection line and a gate electrode of the third transistor are electrically connected to each other.

22. The semiconductor device according to claim 21, further comprises:
a second unit cell selection line; and
a second analog element selection line,
the second unit cell selection line and a gate electrode of the fifth transistor are electrically connected to each other, and
the second analog element selection line and a gate electrode of the seventh transistor are electrically connected to each other.

23. The semiconductor device according to claim 11, wherein the first output signal line is electrically connected to an third input signal line of a third unit cell which belongs to a same row of the first unit cell and is adjacent to the first unit cell.

* * * * *

UNITED STATES PATENT AND TRADEMARK OFFICE
CERTIFICATE OF CORRECTION

PATENT NO. : 9,077,333 B2
APPLICATION NO. : 14/188734
DATED : July 7, 2015
INVENTOR(S) : Takuro Ohmaru It is certified that error appears in the above-identified patent and that said Letters Patent is hereby corrected as shown below:

In the specification

Column 4, line 2, after "invention" replace ":" with --;--;

Column 4, line 11, after "circuit" replace "," with --;--;

Column 4, line 16, after "device" replace ":" with --;--;

Column 9, line 32, after "cells" replace "3210" with --320--;

Column 10, line 20, after "S1" replace "(I:" with --(h:--;

Column 10, line 31, after "1" replace ":" with --;--;

Column 10, line 50, after "satisfying" replace "$2 \leq p \leq n$)" with --$2 \leq p \leq m$)--;

Column 11, line 4, after "in the" replace "(2q+2th" with --(2q+2)th--;

Column 14, line 55, after "sputtering" replace "." with --,--;

Column 18, line 3, after "cerium" replace "(Cc)," with --(Ce)--;

Column 18, line 11, after "oxide" replace "." with --,--;

Column 18, line 19, after "oxide" replace "." with --,--;

Column 19, line 20, after "oxide" replace ":" with --;--;

Column 19, line 27, after "oxide" replace "." with --,--;

Column 19, line 29, after "oxide" replace "." with --,--;

Column 19, line 32, after "oxide" replace "." with --,--;

Column 20, line 20, after "ratio" replace "." with --,--;

Column 21, line 64, before "atom" replace "in" with --In--;

Column 23, line 57, after "formula" replace "." with --,--;

Column 24, line 9, after "oxide" replace "." with --,--;

Column 27, line 9, after "10 nm to" replace "301" with --300--;

Column 27, line 38, replace "ThE" with --The--;

Signed and Sealed this
Sixteenth Day of August, 2016

Michelle K. Lee
*Director of the United States Patent and Trademark Office*

CERTIFICATE OF CORRECTION (continued)
U.S. Pat. No. 9,077,333 B2

In the specification

Column 27, line 49, after "an" replace "n-Zn—O" with --In—Zn—O--;

Column 28, line 60, replace "235e" with --235c--;

Column 30, line 17, replace "241 b" with --241b--;

Column 31, line 4, after "suppressed" replace ":" with --;--;

Column 32, line 25, after "denoted by" replace "it" with --$\mu$--;

Column 32, line 48, after "channel," replace "$\epsilon$" with --$\varepsilon$--;

Column 32, line 64, after "width," replace "and, and Ware" with --and L and W are--;

Column 33, line 10, after "with" replace "In(IdVg) as" with --In(Id/Vg) as--;

Column 33, line 21, after "40" replace "cm$^3$/" with --cm$^2$/--;

Column 33, line 40, after "results" replace "," with --;--;

Column 33, line 45, after "mobility" replace "t, is" with --$\mu$1 is--;

Column 33, line 65, after "100" replace "cm2V·s" with --cm2/ V·s--;

Column 34, line 40, replace "am," with --nm,--;

Column 34, line 64, after "mobility" replace "(p," with --($\mu$,--;

Column 35, line 9, after "5" replace "am." with --nm.--;

Column 35, line 33, after "is" replace "4-1" with --+1--;

Column 35, line 47, after "approximately" replace "cm3V·s" with --cm2/V·s--;

Column 35, line 48, after "19C" replace ":" with --19C;--;

Column 36, line 43, after "an" replace "n-Sn—Zn—O" with --In—Sn—Zn—O--;

Column 38, line 12, after "film" replace ":" with --;--;

Column 38, line 17, after "to" replace "2×☐10$^2$/cm$^3$," with --2×☐10$^{20}$/cm$^3$,--;

Column 38, line 57, after "when" replace "20" with --2$\theta$--;

Column 39, line 21, replace "1×10$^{-21}$" with --1×10$^{-22}$--;

Column 39, line 22, after "be" replace "1 zA/$\mu$m" with --1 aA/$\mu$m--;

Column 39, line 22, replace "(1×10$^{-21}$" with --(1×10$^{-18}$--;

Column 39, line 52, after "C." insert --,--;

Column 40, line 2, replace "cm$^2$n/V·s" with --cm$^2$/V·s--; and

In the claims

Column 42, line 37, claim 5, after "claim" replace "1" with --4--.